(12) United States Patent
Krelboim et al.

(10) Patent No.: US 10,365,353 B2
(45) Date of Patent: Jul. 30, 2019

(54) PULSED LIGHT ILLUMINATOR FOR VARIOUS USES

(71) Applicant: BRIGHTWAY VISION LTD., Tirat Hacarmel (IL)

(72) Inventors: Alon Krelboim, Tirat Hacarmel (IL); Eyal Levi, Tirat Hacarmel (IL); Alexander Dranovsky, Tirat Hacarmel (IL); Yoav Grauer, Tirat Hacarmel (IL)

(73) Assignee: Brightway Vision Ltd., Tirat Hacarmel (IL)

( * ) Notice: Subject to any disclaimer, the term of this patent is extended or adjusted under 35 U.S.C. 154(b) by 0 days.

(21) Appl. No.: 15/752,558

(22) PCT Filed: Aug. 9, 2016

(86) PCT No.: PCT/IL2016/050867
§ 371 (c)(1),
(2) Date: Feb. 13, 2018

(87) PCT Pub. No.: WO2017/025958
PCT Pub. Date: Feb. 16, 2017

(65) Prior Publication Data
US 2019/0025406 A1    Jan. 24, 2019

(30) Foreign Application Priority Data

Aug. 13, 2015 (IL) .......................... 240571

(51) Int. Cl.
*G01C 3/08* (2006.01)
*G01S 7/484* (2006.01)
(Continued)

(52) U.S. Cl.
CPC .............. *G01S 7/484* (2013.01); *G01S 17/10* (2013.01); *H01S 5/062* (2013.01);
(Continued)

(58) Field of Classification Search
CPC ...... H01S 5/06216; H01S 5/062; H01S 5/183; H01S 5/423; H01S 5/0428; H01S 5/4025; G01S 7/484; G01S 17/10
(Continued)

(56) References Cited

U.S. PATENT DOCUMENTS 7,394,305 B2   7/2008  Fu et al.
7,542,684 B2   6/2009  Matsuda
(Continued)

OTHER PUBLICATIONS

International Search Report dated Nov. 14, 2016 for International Application No. PCT/IL2016/050867, 5 pages.
(Continued)

*Primary Examiner* — Mark Hellner
(74) *Attorney, Agent, or Firm* — Knobbe Martens Olson & LLP

(57) ABSTRACT

Pulsed light illuminator for generating at least one light pulse having a predefined rise time and fall time, including a semiconductor light source, an electronic driver coupled with the light source and a synchronization controller coupled with the electronic driver, the electronic driver including an active switch coupled with the light source, a switch driver coupled with the active switch and the controller, a high voltage power supply, a fast voltage provider, a low voltage power supply, a first switch coupled with the low voltage power supply and the light source, a second switch coupled with the high voltage power supply and the light source and an energy discharger coupled with the light source, the light source for generating and emitting the light pulse, the electronic driver for providing a drive current to the light source and the controller for synchronizing a timing of the active switch via a synchronization signal.

20 Claims, 8 Drawing Sheets

(51) Int. Cl.
*H01S 5/062* (2006.01)
*G01S 17/10* (2006.01)
*H01S 5/183* (2006.01)
*H01S 5/42* (2006.01)
*H01S 5/042* (2006.01)
*H01S 5/40* (2006.01)

(52) U.S. Cl.
CPC .......... *H01S 5/06216* (2013.01); *H01S 5/183* (2013.01); *H01S 5/423* (2013.01); *H01S 5/0428* (2013.01); *H01S 5/4025* (2013.01)

(58) Field of Classification Search
USPC ....................................................... 356/5.01
See application file for complete search history.

(56) References Cited

U.S. PATENT DOCUMENTS

| | | |
|---|---|---|
| 7,792,166 B2 | 9/2010 | Borschowa |
| 8,170,075 B1 | 5/2012 | Borschowa |
| 8,399,819 B2 | 3/2013 | Madhani et al. |
| 8,497,478 B2 | 7/2013 | Madhani et al. |
| 8,497,982 B2 * | 7/2013 | Madhani ............... G01S 7/4814 356/5.05 |
| 9,006,994 B2 | 4/2015 | Madhani et al. |
| 2006/0092099 A1 | 5/2006 | Matsuda |
| 2006/0291512 A1 | 12/2006 | Borschowa |
| 2008/0042733 A1 | 2/2008 | Fu et al. |
| 2010/0243897 A1 | 9/2010 | Madhani et al. |
| 2010/0244737 A1 | 9/2010 | Madhani et al. |
| 2010/0244795 A1 | 9/2010 | Madhani et al. |
| 2010/0245802 A1 | 9/2010 | Madhani et al. |
| 2014/0139603 A1 * | 5/2014 | Fujita ................... H01S 5/0427 347/118 |
| 2014/0211192 A1 * | 7/2014 | Grootjans .......... H05B 33/0818 356/5.01 |

OTHER PUBLICATIONS

Written Opinion of the International Searching Authority dated Nov. 14, 2016 for International Application No. PCT/IL2016/050867, 4 pages.

* cited by examiner

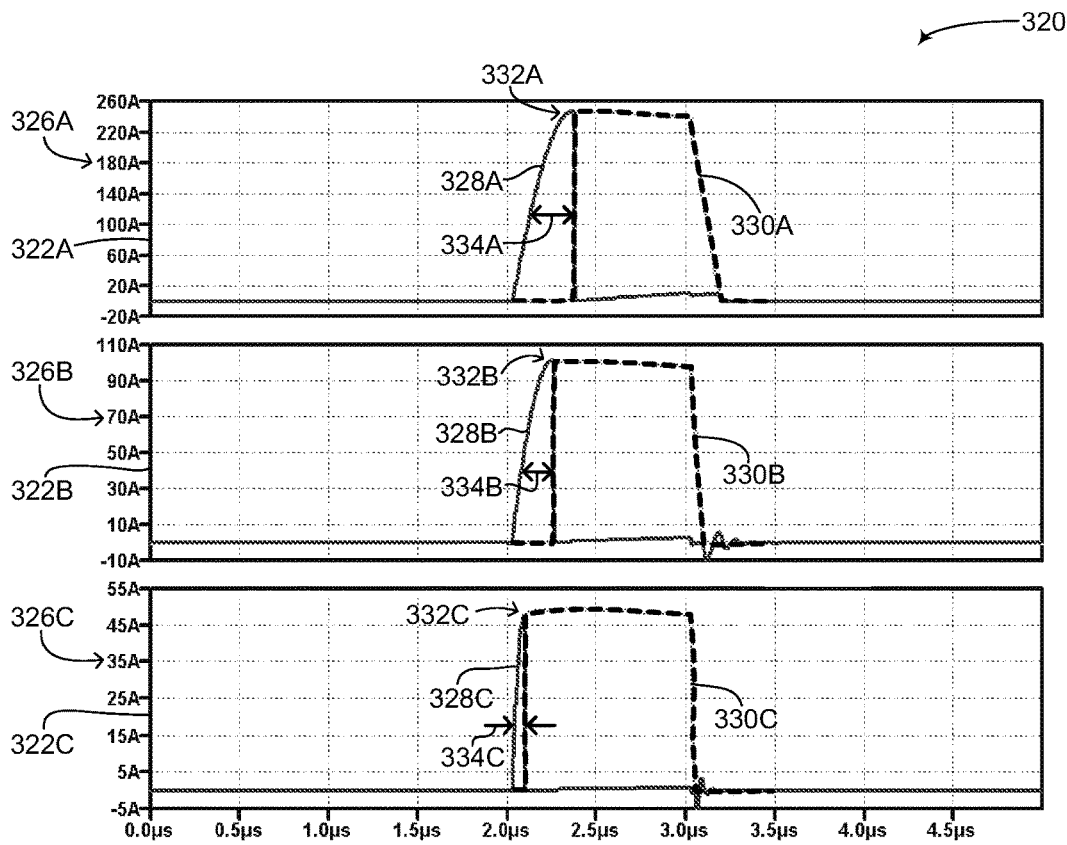
FIG. 7
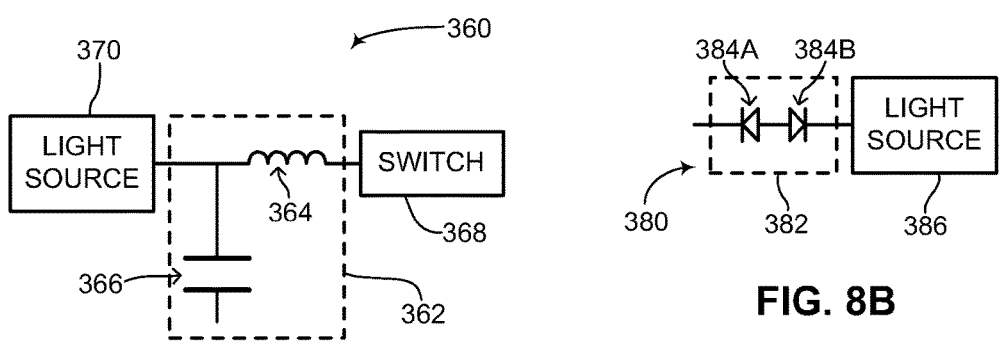
FIG. 8A
FIG. 8B
FIG. 8C

PULSED LIGHT ILLUMINATOR FOR VARIOUS USES

CROSS REFERENCE TO RELATED APPLICATIONS

This application is the U.S. National Phase Application under 35 U.S.C. § 371 of International Application No. PCT/Th2016/050867, filed Aug. 9, 2016, designating the U.S. and published as WO 2017/025958 A1 on Feb. 16, 2017 which claims the benefit of Israel Patent Application No. IL240571, filed Aug. 13, 2015, both of which are hereby incorporated by reference in their entirety.

FIELD OF THE DISCLOSED TECHNIQUE

The disclosed technique relates to laser systems, in general, and to methods and systems for a pulsed light illuminator for use in a variety of systems and applications, in particular.

BACKGROUND OF THE DISCLOSED TECHNIQUE

Gated imaging systems are known in the art and have found use in many areas of technology such as in law enforcement, the maritime and fishing industries, medical imaging, transportation and the military. Such systems usually employ a light source, such as a laser, which produces laser pulses aimed at an object or scene of observation. A sensor, such as a camera, is timed in coordination with the emitting of the laser pulses to open and close its shutter to receive reflections of the laser pulses from the object or scene. Received reflections can then be used to produce an image of the object or scene as well as three-dimensional information of the object or scene.

Laser pulses to be used in a gated imaging system can be produced in many different ways. For example, a laser may be operated in a continuous wave (herein abbreviated CW) mode with a shutter placed at its output. By opening and closing the shutter at various speeds or frequencies, the CW laser can be made to produce laser pulses. Techniques such as mode-locking, Q-switching and gain-switching can also be used to produce laser pulses, as is known in the art. Light pulses in general, and laser pulses in particular, are substantially bursts of electromagnetic energy having a finite duration with a substantially clear beginning and end in time. In order to establish a common terminology for referring to laser pulses and light pulses in this application, reference is now made to FIG. 1, which is a graph illustrating various sections of a light pulse, generally referenced 10, as is known in the prior art. Graph 10 includes an X-axis 12 and a Y-axis 14. Graph 10 is merely schematic and therefore does not show any numerical values. X-axis 12 represents time and Y-axis 14 represents current, where current is a measure of flow and is used in FIG. 1 to represent the energy of a laser pulse 16. It is noted that voltage is not shown in FIG. 1 but is implied. Laser pulse 16 is an idealized laser pulse and includes a number of different sections such as a rise time 18, a pulse width 20, a fall time 22 and a delay time 24. Rise time 18 represents an increase in intensity of the current from about 10% to 90% of the intensity of the current at pulse width 20. Fall time 22 represents a decrease in intensity of the current from about 90% to 10% of the intensity of the current at pulse width 20. A plurality of dotted lines 30 demarcates the beginning and end of each section of laser pulse 16. The combined time duration of rise time 18 (in this case, starting from 0% of the intensity of the current at the pulse width), pulse width 20, fall time 22 and delay time 24 forms a period 28 of laser pulse 16. After period 28, a second laser pulse 26 begins to form. Period 28 substantially represents the time duration of the formation of a pulse until the formation of a subsequent pulse, as shown in FIG. 1.

Laser pulse 16 begins at an arbitrary current $A_0$, which may be zero or some other number representing a current at which no laser pulse is generated. During rise time 18, the current of laser pulse 16 begins to climb from $A_0$ to $A_1$, with $A_1$ representing the desired energy and intensity at which laser pulse 16 is supposed to be at. Rise time 18 therefore represents the time duration required to generate the requisite energy for laser pulse 16. Once 90% of $A_1$ has been reached, rise time 18 ends and pulse width 20 begins. Pulse width 20 is substantially the laser pulse referred to when referring to laser pulses and is the full powered laser pulse which is reflected off of an object or scene of observation and is received by a sensor or camera for gaining information about the object or scene. It is noted that the sections of the laser pulse in rise time 18 and fall time 22 may also be received by a sensor or camera for gaining information. Fall time 22 is the time duration during which the current of laser pulse 16 descends from 90% of $A_1$ to about 10% of $A_1$ (i.e., in the direction of $A_0$), thus representing the termination of laser pulse 16. Delay time 24 represents the time duration between the end of laser pulse 16 and the next laser pulse, such as second laser pulse 26. Rise time 18 can also be referred to as the time duration during which a laser pulse is generated, fall time 22 can also be referred to as the time duration during which a laser pulse is terminated and pulse width 20 can also be referred to as the time duration during which a laser pulse is maintained.

As can be seen in FIG. 1, various characteristics of laser pulses can be described based on the ratio of the time duration of the various sections of laser pulse 16. For example, the duty cycle of a pulse, such as a laser pulse represents the ratio of substantially how much time in a period is a laser pulse generated and maintained as compared to the delay time when no laser pulse is produced. Duty cycle can in general be used to describe the ON/OFF ratio of any device having an ON state and an OFF state. A high duty cycle laser pulse is one in which there is more pulse width than delay time whereas a low duty cycle laser pulse is one in which there is more delay time than pulse width. This can include a scenario where there is no pulse width but substantially only a rise time and a fall time. Both the rise time and the fall time of laser pulse 16 can be characterized in terms of how quickly or slowly a laser pulse is generated and terminated.

As mentioned above, gated laser systems have been in use in many industries for a variety of purposes. Such systems usually include at least a laser and an electronic circuit or processor. The laser is designed to substantially produce a laser pulse having a specific pulse width. The laser pulse can either be generated by using a known laser technique for generating laser pulses, such as by mode-locking or Q-switching, or via a CW laser outfitted with a shutter which is opened and closed, thereby only allowing pulses of the generated laser light to exit. The electronic circuit or processor is used to time and synchronize the generation of laser pulses, for example by deciding when the shutter on the laser is opened or closed in a CW laser. It is in this respect that such laser systems are termed "gated" laser systems, the "gating" referring to the timing and synchronization of when laser pulses are produced. Examples of known uses of gated laser pulses are etching and marking products, performing surgery, estimating distances and determining the speed of moving objects.

Gated imaging systems are similar to gated laser systems, however such systems also include at least one sensor for sensing reflections of the generated laser pulses off of objects in a scene. In such systems, the sensor also includes a shutter which can be opened or closed for only receiving reflections of generated laser pulses at specific times. The electronic circuit or processor in such systems controls and synchronizes the generation of laser pulses as well as the opening and closing of the shutter on the sensor. In general, gated imaging systems are designed to image specific distances in front of such systems (i.e., a specific depth of field). In such systems, a laser pulse is generated. During the generation of the laser pulse, the shutter of the sensor is closed and does not accumulate any reflected photons of the laser pulse. As the speed of light is known, the opening of the shutter is timed to remain closed until photons from the emitted laser pulse have traveled enough time to a desired depth of field (herein abbreviated DOF) and have reflected back towards the sensor. At this point the shutter of the sensor is opened and photons are accumulated for a determined amount of time, substantially equivalent for all the photons of the generated laser pulse to have arrived at the desired DOF and to have reflected back to the sensor. After the predetermined amount of time has passed, the shutter on the sensor is closed and subsequent laser pulse may be emitted to the desired DOF. It is noted the terms 'opened' and 'closed' can include substantially opened and substantially closed, such that an open shutter may only accumulate a significant percentage (i.e., not necessarily 100%) of the reflected photons and a closed shutter may nonetheless accumulate a small percentage (i.e., not necessarily 0%) of the reflected photons. An open sensor may mean a relatively open sensor and a closed sensor may mean a relatively closed sensor. Thus the sensor remains closed to reflections of the laser pulse for the duration of time required for the laser pulse to travel toward a desired DOF and be reflected back to the sensor. The sensor is thus only activated for the duration of time required to receive the reflected photons of the laser pulsed from the desired DOF. In this manner, the sensor receives only reflections from the desired DOF, or at least a significant portion of the reflections from the desired DOF and avoids accumulating photons, or at least most photons from reflections of the laser pulse from objects either closer than the DOF, such as particles in the atmosphere, or farther than the DOF. The accumulated photons can then be used to generate an image of the desired DOF and any objects located therein and in this respect such systems are referred to as "gated imaging" systems, since an image is generated by only using reflections of photons from a certain DOF. Avoiding the accumulation of photons from objects in a range closer than the desired DOF is important in such systems since such objects may cause backscattering in the generated image and which can substantially reduce the contrast of objects which may be located in the desired DOF.

Gated imaging systems are usually designed with specific purposes in mind. As such, the laser used, the method of how laser pulses are generated, the characteristics of the laser pulses generated as well as the type, quality and responsiveness of the sensor used for receiving reflected laser pulses are all specifically selected. Any given real-life situation includes constraints and limitations which much be taken into consideration when designing a gated imaging system. However in many specialized fields of technology where gated imaging systems are used, these constraints and limitations may be quite loose as compared to gated imaging systems for the transportation industry. For example, in specialized medical imaging equipment or gated image laser rangefinders used in the army, the cost and weight of such systems may be substantially unrestrained. High quality expensive parts may be used to build a suitable laser for producing laser pulses, sufficient support structures may be built to house, carry and manipulate these gated imaging systems and substantially any desired laser pulse with specific characteristics for a given purpose may be designed. In addition, ultra-fast sensors may be used for imaging very specific desired DOFs. For the transportation industry however, cost, size, reliability, manufacturing simplicity and weight may become significant constraints. For example, it may not be possible to reliably achieve certain characteristics for a desired laser pulse when transportation industry quality inexpensive parts are to be used in the construction of a laser or a laser driver. And even if such characteristics can be achieved using inexpensive parts, the laser constructed might need a supporting structure, such as a specialized cooling unit, which could increase its weight, size and maneuverability significantly.

One use of a gated imaging system in the transportation industry might include an all-weather low visibility vision system installed in a consumer's vehicle. Such a gated imaging system has a number of constraints, such as a specific input voltage (from the vehicle's battery) for operating the system and a relatively low cost, for example under $1000.00. For example, a regular consumer car battery might operate in the range of 12-14 volts whereas a truck or bus might operate in the range of 24-36 volts. In addition, such a system might have requirements such as the ability to produce an optical peak power of at least a few hundred watts, for example 700 watts, in order to image sufficiently far enough ahead of the vehicle. Such systems might also need to produce laser pulses with a pulse width on the order of microseconds with a rise time and fall time on the order of hundreds of nanoseconds, or possibly on the order of nanoseconds, in order to receive sufficiently clean reflections of the generated laser pulses from objects in a scene of observation.

Reference is now made to FIG. 2A, which is a schematic illustration of a pulsed laser for use in a gated imaging system, generally referenced 50, as is known in the prior art. Pulsed laser 50 includes an electronic driver 54, a laser module 56 and an optical arrangement (not shown). Electronic driver 54 is coupled with laser module 56 via a connection 60, providing laser module 56 with a drive current suitable to produce a desired optical power (including peak power and average power) in the laser pulses produced by laser module 56, as shown by an arrow 58 which represents the produced laser pulses. The optical arrangement may be placed in front of laser module 56 for producing a focused laser pulse. The optical arrangement may also be a part of laser module 56. Both electronic driver 54 and laser module 56 may be housed on a printed circuit board (herein abbreviated PCB) 52. The coupling of electronic driver 54 and laser module 56 to PCB 52 as well as connection 60 may cause power dissipation in pulsed laser 50 thus resulting in a less efficient pulsed laser. In addition, connection 60 introduces a parasitic inductance (not shown) between electronic driver 54 and laser module 56. The parasitic inductance reduces the amount of actual current provided by electronic driver 54 to laser module 56, thus also degrading the rise time and fall time of the generated laser pulse. The power dissipation mentioned above as well as the parasitic inductance thereby reduces the efficiency of pulsed laser 50. In this respect, additional power may need to be provided by electronic driver 54 to laser module 56 to achieve a desired rise time, pulse width and fall time of the generated laser pulse.

Reference is now made to FIG. 2B, which is a schematic illustration of the pulsed laser of FIG. 2A in greater detail, generally referenced 70, as is known in the prior art. Pulsed laser 70 is to be used in a gated imaging system given the constraints and requirements listed above for a transportation consumer. Pulsed laser 70 includes a laser module 81 and an electronic driver 84. Laser module 81 is substantially similar to laser module 56 (FIG. 2A) and electronic driver 84 is substantially similar to electronic driver 54 (FIG. 2A). Laser module 81 includes a laser 76 and optics 86. Electronic driver 84 includes a power supply 72, a blocking diode 74, an active switch 78 and a timing controller 80. Laser module 81 is coupled with electronic driver 84, as shown and as was shown in FIG. 2A. In electronic driver 84, power supply 72 is coupled with blocking diode 74 and timing controller 80 is coupled with active switch 78. In laser module 81, laser 76 is coupled with optics 86. Both active switch 78 and blocking diode 74 are coupled with laser 76, thus coupling electronic driver 84 with laser module 81. Active switch 78 is coupled with a ground terminal 82.

Power supply 72 may be coupled with the power supply of a vehicle (not shown) and provides current to laser 76 via blocking diode 74. Power supply 72 may be a DC-to-DC converter. Blocking diode 74 prevents any backflow current from laser 76 from reaching power supply 72. Laser 76 receives the current from power supply 72 however laser 76 only produces laser pulses when active switch 78 is activated and laser 76 is coupled with ground terminal 82. Laser 76 thus produces laser pulses via the switching action of active switch 78. Electronic driver 84 as a whole provides a drive current to laser 76 for creating the optical power of the laser pulses generated by laser 76, as shown by an arrow 88. A focused laser pulse is produced from laser 76 via optics 86. Timing controller 80 controls the timing of active switch 78, thus controlling when laser 76 generates laser pulses. Timing controller 80 may be controlled by a sensor (not shown) of the gated imaging system (not shown) pulsed laser 70 is used with. The sensor may be a camera. In addition, timing controller 80 may be controlled by an external electronic circuit (not shown) or processor (not shown). The rate at which power supply 72 can provide current to laser 76 and the speed at which active switch 78 can be turned on and off determine certain characteristics of the generated laser pulses by laser 76, including the rise time, pulse width, fall time, number of laser pulses and laser pulse frequency of the generated laser pulses.

Reference is now made to FIG. 3, which is a graph illustrating the change in current of a laser pulse over time as generated by the pulsed laser of FIG. 2B, generally referenced 90, as is known in the prior art. Graph 90 includes an X-axis 91 and a Y-axis 92. X-axis 91 represents time in microseconds and Y-axis 92 represents current in amperes. A curve 93 shows the change in current of a laser pulse produced by pulsed laser 70 (FIG. 2B), which is also indicative of the change in optical power of the laser pulse emitted by pulsed laser 70. As shown in FIG. 3, curve 93 substantially exhibits a rise time 94 and a fall time 95 without any substantial pulse width (not labeled). The start of rise time 94 and the end of fall time 95 shows that the emitted pulse has a duration of about 1.3 microseconds, having a rise time close to 1 microsecond. As described above, such a pulse does not fit the suitable characteristics for a gated imaging system for the transportation industry where a pulse width on the order of microseconds is desired along with a rise time and fall time on the order of hundreds or even tens of nanoseconds. A sufficiently fast rise time and fall time is desired in order to avoid blurring in images generated from reflections of the generated laser pulses from objects in a scene of observation. In addition, a sufficiently fast rise time and fall time will enable better three-dimensional accuracy of gated imaging systems such as laser range finders and time-of-flight sensors, better visibility performance in inclement weather (e.g., smog, rain, snow, fog and the like) and a shorter and sharper DOF.

What is thus desired is a pulsed light source for use in a gated imaging system which suits the constraints and limitations of the transportation industry. As mentioned above these constraints and limitations include sufficient optical power to image at least a few hundred meters, the ability to use transportation industry quality parts in constructing the pulsed light source, a light pulse having a sufficiently fast rise time and fall time on the order of hundreds or even tens of nanoseconds, with a pulse width on the order of microseconds, as well as being cost effective.

SUMMARY OF THE PRESENT DISCLOSED TECHNIQUE

It is an object of the disclosed technique to provide a novel pulsed light illuminator for various uses, including in a gated imaging system, which is light weight, relatively small in size, energy and power efficient and cost effective. In accordance with the disclosed technique, there is thus provided a pulsed light illuminator for generating at least one light pulse having a predefined rise time and fall time, including a semiconductor light source, an electronic driver and a synchronization controller. The electronic driver is coupled with the semiconductor light source and with the electronic driver. The electronic driver includes an active switch, a switch driver, a high voltage power supply, a fast voltage provider, a low voltage power supply, a first switch, a second switch and an energy discharger. The active switch is coupled with the semiconductor light source, the switch driver is coupled with the active switch and the synchronization controller, the first switch is coupled with the low voltage power supply and the semiconductor light source, the second switch is coupled with the high voltage power supply and the semiconductor light source and the energy discharger is coupled with the semiconductor light source.

The semiconductor light source is for generating and emitting the light pulse, the electronic driver is for providing a drive current to the semiconductor light source and the synchronization controller is for synchronizing a timing of the active switch via a synchronization signal. The active switch is for enabling and disabling the drive current through the semiconductor light source, the high voltage power supply is for generating a high first polarity voltage and the fast voltage provider is for rapidly providing the generated high first polarity voltage to the semiconductor light source. The low voltage power supply is for generating a low voltage, the first switch is for protecting the low voltage power supply from the high voltage power supply, the second switch is for preventing current backflow towards the high voltage power supply and the switch driver is for amplifying the synchronization signal.

When the active switch is enabled, the high first polarity voltage is provided from the fast voltage provider to the semiconductor light source for generating a rise time of the light pulse and the low voltage is provided to the semiconductor light source for maintaining a pulse width of the light pulse. When the active switch is disabled, a fall time of the light pulse is achieved for terminating the light pulse, with the semiconductor light source exhibiting a high second polarity voltage. The energy discharger enables the high second polarity voltage to discharge from the semiconductor light source, thereby accelerating the fall time.

According to another aspect of the disclosed technique, there is thus provided a low visibility vision system including a pulsed light illuminator, a sensor and a processor. The sensor is coupled with the pulsed light illuminator and the processor is coupled with the sensor and the pulsed light illuminator. The pulsed light illuminator is for generating at least one light pulse having a predefined rise time and fall time for illuminating at least one object. The sensor is for sensing at least one reflection of the light pulse from the object and the processor is for generating a signal representative of the object from the reflection.

The pulsed light illuminator includes a semiconductor light source, an electronic driver and a synchronization controller. The electronic driver is coupled with the semiconductor light source and with the synchronization controller. The electronic driver includes an active switch, a switch driver, a high voltage power supply, a fast voltage provider, a low voltage power supply, a first switch, a second switch and an energy discharger. The active switch is coupled with the semiconductor light source, the switch driver is coupled with the active switch and the synchronization controller, the first switch is coupled with the low voltage power supply and the semiconductor light source, the second switch is coupled with the high voltage power supply and the semiconductor light source and the energy discharger is coupled with the semiconductor light source.

The semiconductor light source is for generating and emitting the light pulse, the electronic driver is for providing a drive current to the semiconductor light source and the synchronization controller is for synchronizing a timing of the active switch via a synchronization signal. The active switch is for enabling and disabling the drive current through the semiconductor light source, the high voltage power supply is for generating a high first polarity voltage and the fast voltage provider is for rapidly providing the generated high first polarity voltage to the semiconductor light source. The low voltage power supply is for generating a low voltage, the first switch is for protecting the low voltage power supply from the high voltage power supply, the second switch is for preventing current backflow towards the high voltage power supply and the switch driver is for amplifying the synchronization signal.

When the active switch is enabled, the high first polarity voltage is provided from the fast voltage provider to the semiconductor light source for generating a rise time of the light pulse and the low voltage is provided to the semiconductor light source for maintaining a pulse width of the light pulse. When the active switch is disabled, a fall time of the light pulse is achieved for terminating the light pulse, with the semiconductor light source exhibiting a high second polarity voltage. The energy discharger enables the high second polarity voltage to discharge from the semiconductor light source, thereby accelerating the fall time.

BRIEF DESCRIPTION OF THE DRAWINGS

The disclosed technique will be understood and appreciated more fully from the following detailed description taken in conjunction with the drawings in which:

FIG. 7 is a diagram illustrating differences in current response over time as a function of current in a light pulse, constructed and operative in accordance with a further embodiment of the disclosed technique;

FIG. 8A is a schematic illustration of a first embodiment of the fast voltage provider of the pulsed light illuminator of FIG. 4, constructed and operative in accordance with another embodiment of the disclosed technique;

FIG. 8B is a schematic illustration of a first embodiment of the energy discharger of the pulsed light illuminator of FIG. 4, constructed and operative in accordance with a further embodiment of the disclosed technique;

FIG. 8C is a schematic illustration of a second embodiment of the energy discharger of the pulsed light illuminator of FIG. 4, constructed and operative in accordance with another embodiment of the disclosed technique;

DETAILED DESCRIPTION OF THE EMBODIMENTS

Figure 1:
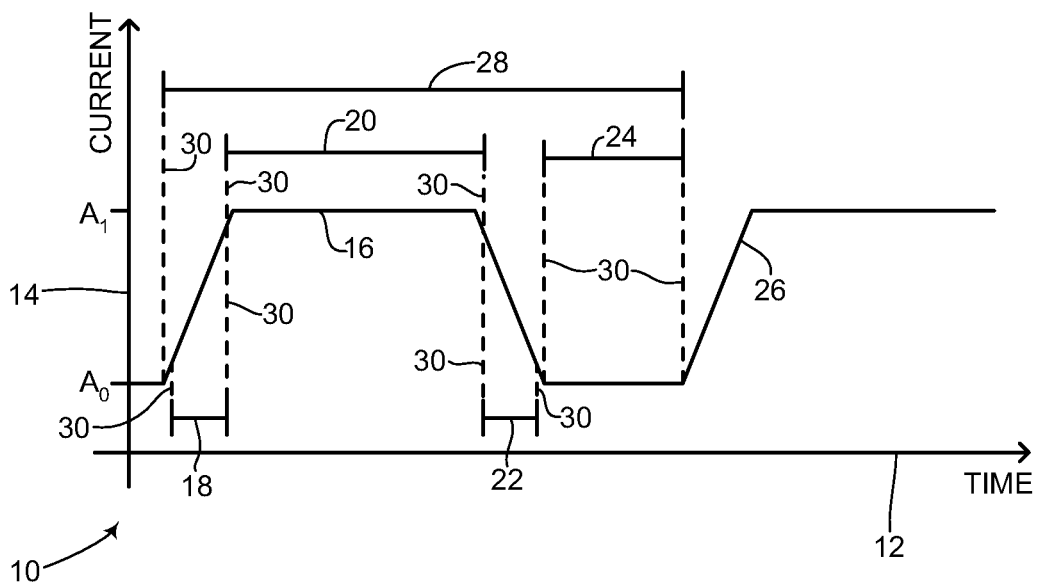
FIG. 1 is a graph illustrating various sections of a light pulse, as is known in the prior art.

The disclosed technique overcomes the disadvantages of the prior art by providing a pulsed light illuminator for various uses, including in a gated imaging system, which is light weight, relatively small in size, energy and power efficient and cost effective. The pulsed light illuminator can provide ample optical power for a gated imaging system for imaging objects and a scene of observation a few hundred meters in front of the gated imaging system, providing light pulses with a sufficiently fast rise time and fall time on the order of tens to hundreds of nanoseconds and a sufficiently long and stable pulse width on the order of microseconds. The pulsed light illuminator can be made from transportation industry quality parts and is thus suitable to transportation level consumers.

The pulsed light illuminator of the disclosed technique uses two voltage power supplies for generating light pulses with desired characteristics. A high voltage power supply is used to generate a sufficiently fast rise time and achieve a sufficiently fast fall time of the light pulse whereas a low voltage power supply is used to maintain a stable pulse width of the light pulse for a suitable amount of time. A fast voltage provider and an energy discharger are used along with an active switch to control timing and synchronization of the emitted light pulses. Faster rise times and fall times are possible in the disclosed technique by increasing the working voltage of both voltage power supplies. By increasing the working voltage, a lower working current can be used in the pulsed light illuminator, leading to the ability to use more cost effective components. According to another embodiment of the disclosed technique, faster rise times and fall times are possible by reducing the inductance in the components used in the assembly of the pulsed light illuminator. In general, according to the disclosed technique, by increasing the working voltage, the rise time and the fall time of the generated light pulses can be significantly shortened whereas by decreasing the working current, higher efficiency in the pulsed light illuminator can be achieved while being able to use less expensive parts. According to the disclosed technique, in an embodiment where the pulsed light illuminator is placed on a moving platform, the working voltage and working current can be modified as a function of a velocity, acceleration, location or orientation of the moving platform. Location of the moving platform can include classifications such as urban, interurban, suburban and the like. The orientation of the moving platform can include the direction of a rudder, helm, steering wheel and the like. The working voltage and working current can also be modified as a function of the climactic conditions in which the pulsed light illuminator is used, such as in inclement weather like snow, rain, fog, hail and the like. The modification of the working voltage and working current can thus keep the emitted light pulses within an eye-safe and skin-safe level while providing sufficient illumination to objects and a scene of observation situated a few hundred meters in front of the moving platform. In addition, according to another embodiment of the disclosed technique, the light source of the pulsed light illuminator is constructed from a plurality of vertical-cavity surface-emitting lasers (herein abbreviated VCSELs). The VCSELs can be constructed on a single integrated chip (herein abbreviated IC), wherein sub-clusters of VCSELs are coupled in series, with a plurality of VCSELs on a single sub-cluster being coupled in parallel. The routes coupling the VCSELs can be made on the die level of the IC, thereby decreasing the distance between individual VCSELs, decreasing the overall assembly process of the light source by constructing the VCSELs on a single IC instead of a few and also decreasing the overall surface area of the PCB the pulsed light illuminator is mounted on. This decrease in distance and overall area enables a decrease in parasitic inductance in the PCB, thus leading to greater power efficiency and a shorter rise time and fall time. This decrease in distance and overall area also results in less power dissipation from the PCB, thus leading to a smaller heat sink and a smaller and therefore cheaper pulsed light illuminator, thus achieving a more efficient pulsed light illuminator according to the disclosed technique.

It is noted that the disclosed technique, which is a pulsed light illuminator, is described herein using the example of gated imaging. However gated imaging is merely brought as an example. The disclosed technique can be applied and used in numerous applications such as time of flight systems, laser range finding systems, laser designators and the like.

Figure 4:
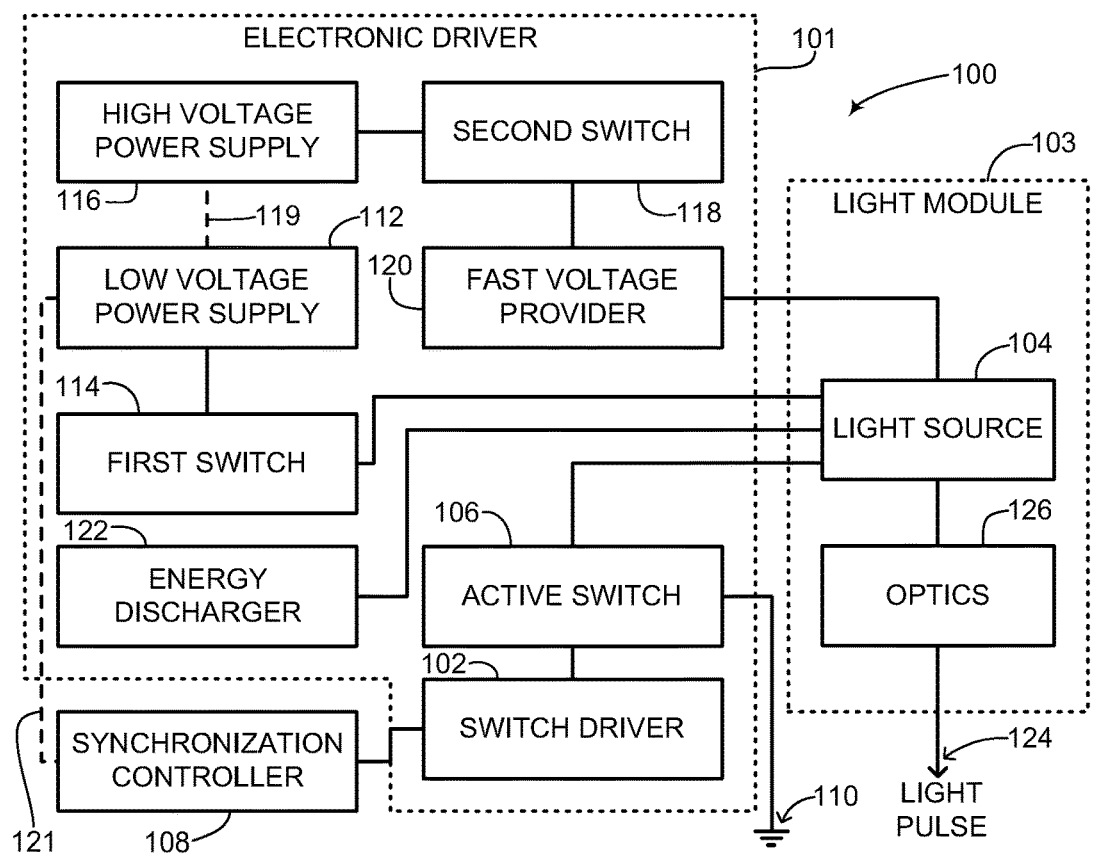
FIG. 4 is a schematic illustration of a pulsed light illuminator for use in a gated imaging system, constructed and operative in accordance with an embodiment of the disclosed technique.

Reference is now made to FIG. 4, which is a schematic illustration of a pulsed light illuminator for use in a gated imaging system, generally referenced 100, constructed and operative in accordance with an embodiment of the disclosed technique. As mentioned above, FIG. 4 merely shows an example of a use of the pulsed light illuminator of the disclosed technique. Pulsed light illuminator 100 includes an electronic driver 101, a light module 103 and a synchronization controller 108. Electronic driver 101 includes a switch driver 102, an active switch 106, a low voltage power supply 112, a first switch 114, a high voltage power supply 116, a second switch 118, a fast voltage provider 120 and an energy discharger 122. It is noted that fast voltage provider 120 as a separate component as illustrated in FIG. 4 is optional and may in another embodiment of the disclosed technique be embodied internally as part of high voltage power supply 116 or as part of second switch 118. Light module 103 includes a light source 104 and an optical arrangement 126 (shown as optics 126 in FIG. 4). Active switch 106 is coupled with switch driver 102 and light source 104 and is also coupled with a ground terminal 110. First switch 114 is coupled with light source 104 and low voltage power supply 112. Second switch 118 is coupled with high voltage power supply 116 and fast voltage provider 120. In another embodiment of the disclosed technique, fast voltage provider 120 may be coupled between high voltage power supply 116 and second switch 118. In such an embodiment, or if fast voltage provider 120 is embodied internally in another component in electronic driver 101, then second switch 118 is coupled with light source 104 directly. Light source 104 is coupled with fast voltage provider 120, energy discharger 122 and optical arrangement 126. Light source 104 may also be coupled directly with second switch 118 is fast voltage provider 120 is embodied as an internal component in second switch 118 or high voltage power supply 116. Synchronization controller 108 is coupled with switch driver 102. As shown, light source 104 emits light pulses via optical arrangement 126, as shown by an arrow 124. Optical arrangement 126 can include at least one optical element or a plurality of optical elements, such as lenses, diffusers, fibers, light guides, prisms and mirrors (all not shown) for focusing and defocusing any light pulse generated by light source 104 and directing it in a particular direction, as shown by arrow 124. As shown, synchronization controller 108 is coupled with electronic driver 101 via switch driver 102. Electronic driver 101 is coupled with light module 103 via the couplings of light source 104 with fast voltage provider 120 (or directly with second switch 118 in an embodiment where fast voltage provider 120 is embodied internally in another component in electronic driver 101), first switch 114, energy discharger 122 and active switch 106. As described below, low voltage power supply 112 may be optionally coupled with high voltage power supply 116 in one embodiment of the disclosed technique, as shown by a dotted line 119. In addition, synchronization controller 108 may be optionally coupled with low voltage power supply 112 in another embodiment of the disclosed technique, as shown by a dotted line 121.

Light source 104 may be embodied as a semiconductor light source. Possible semiconductor light sources include at least one VCSEL (i.e., a single emitter or an array of emitters), at least one edge-emitting laser (i.e., a single emitter or an array of emitters), at least one quantum dot laser, at least one array of light-emitting diodes (herein abbreviated LEDs) and the like. Light source 104 may have one central wavelength or a plurality of central wavelengths. Light source 104 may have a narrow spectrum, such as on the order of ~10 nanometers, or a wide spectrum, such as longer than 10 nanometers, for example on the order of ~30-50 nanometers in the case light source 104 is embodied as at least one array of LEDs. Light source 104 may also be embodied as an intense pulsed light (herein abbreviated IPL) source. If light source 104 is embodied as a semiconductor light source, then light source 104 might be optionally coupled with a heat dissipator (not shown), for dissipating heat generated by the semiconductor light source. The heat dissipator may also be optionally coupled with electronic driver 101 for dissipating heat generated by any of the electronic components in electronic driver 101. The heat dissipator can be embodied as a passive element, an active element, a thermo-electric cooler (herein abbreviated TEC), a heat pipe, a water cooler, an active vent and the like. For some applications, light source 104 substantially operates with a low overall duty cycle. For example, the low overall duty cycle might be at most 10% and might also include light source 104 operating in a burst mode. A burst mode is when a plurality of light pulses are generated at the beginning of a cycle of light pulses followed by a significant time delay before more light pulses are emitted. For example, if light source 104 was to operate in a burst mode, a light pulse of 1 microsecond may be generated followed by a time delay of 9 microseconds before another light pulse is generated. Using another example, a light pulse of 10 microseconds may be generated followed by a time delay of 100 microseconds. After one hundred of such pulses, only 1 millisecond was spent generating pulses (100×10 µs) whereas 10 milliseconds were used as a time delay (100×100 µs). The number of light pulses and the type of light pulse may vary within a single burst and/or between bursts. Applications in which light source 104 may operate in a low overall duty cycle include environments where many systems similar to pulsed light illuminator 100 are being used and where there is a continuous source of ambient light (for example street lighting and oncoming vehicles with low/high beams on and the like). In general, a burst mode is desired when there are other sources of CW light in the vicinity of pulsed light illuminator 100 which may be accumulated by pulsed light illuminator 100. To avoid or at least minimize the amount of accumulated CW light coming from other light sources, it is desirable for pulsed light illuminator 100 to work as fast as possible in terms of producing light pulses and receiving reflections. Light source 104 may also be operated in a low overall duty cycle when improved eye safety is required (for example environments with a high human population density like city driving) or where the significant time delay between light pulses is to be used for collecting other light related information. For other applications, light source 104 substantially operates with a high overall duty cycle. For example, the high overall duty cycle might be as high as 50%. As above, the number of light pulses and the type of light pulse may vary. Applications in which light source 104 may operate in a high overall duty cycle include environments where few systems similar to pulsed light illuminator 100 are being used and where it is desired to image substantially long distances (such as above 1 kilometer). Whereas a burst mode could be used for imaging substantially long distances, immense power would be required for the imaging. In addition, high overall duty cycle operation may be desired when more than average power is required for imaging. Light source 104 may also be operated in a high overall duty cycle when improved eye safety is not required (for example on interstates or country roads) or where no significant time delay between light pulses is needed for collecting other light related information. Furthermore, light source 104 may be operated in a high overall duty cycle for longer distance applications, such as imaging more than 1000 meters in front of pulsed light illuminator 100.

Low voltage power supply 112 can be embodied as a DC/DC power supply, a powerful direct current (herein abbreviated DC) power supply and the like and in the gated imaging system example of FIG. 4 substantially provides a voltage of between 2-30 volts. Low voltage power supply can also provide other voltage ranges. A powerful DC power supply in this case refers to a DC power supply that has a peak power of approximately 1500-2000 watts. High voltage power supply 116 can be embodied as a DC/DC power supply, any known voltage multiplier and the like and in the gated imaging system example of FIG. 4 substantially provides a voltage of between 10-60 volts. High voltage power supply can also provide other voltage ranges. As described in further detail below, both low voltage power supply 112 and high voltage power supply 116 provide electrical power and energy to light source 104. Low voltage power supply 112 provides low voltage power to light source 104 substantially directly via first switch 114 whereas high voltage power supply 116 provides high voltage power to light source 104 via second switch 118 and fast voltage provider 120. Fast voltage provider 120 is needed to provide high voltage energy rapidly and quickly to light source 104 for generating a light pulse with a substantially fast rise time. Standard off-the-shelf high voltage power supplies cannot provide the requisite high voltage to light source 104 fast enough and therefore fast voltage provider 120 is needed in order for there to be a fast and ready supply of high voltage energy to light source 104 when active switch 106 is enabled. As described below, fast voltage provider 120 can be embodied in different ways and does not necessarily need to be embodied as a standalone component as shown in FIG. 4. As mentioned, in one embodiment (not shown), the fast voltage provider forms a part of high voltage power supply 116 such that high voltage power supply 116 can provide high voltage energy via second switch 118 to light source 104 rapidly once active switch 106 is enabled. It is noted that high voltage power supply 116 can cause high voltage spikes in pulsed light illuminator 100. In one embodiment of the disclosed technique, fast voltage provider 120 can be embodied as an energy bank which stores a substantial amount of power. In this embodiment, current backflow from fast voltage provider 120 can leak towards both low voltage power supply 112 and high voltage power supply 116. First switch 114 and second switch 118 are provided in pulsed light illuminator 100 for respectively protecting both low voltage power supply 112 and high voltage power supply 116 from current backflow from fast voltage provider 120 in such an embodiment. In addition, first switch 114 protects low voltage power supply 112 from high voltage spikes and from high voltage power supply 116. Furthermore, since low voltage power supply 112 and high voltage power supply 116 are both needed to provide voltage to light source 104 for generating a light pulse yet each of them has a significantly different electrical potential (i.e., voltage) they cannot both be coupled directly with light source 104 as that would cause at least one of the power supplies (most probably the low voltage power supply) to burn out. In order to enable both power supplies to be coupled with light source 104, while nonetheless providing some electrical separation between them, each of low voltage power supply 112 and high voltage power supply 116 is coupled with light source 104 via a respective switch (i.e., first switch 114 and second switch 118). Each one of first switch 114 and second switch 118 can be embodied as either a passive switch or an active switch. As a passive switch, first switch 114 and second switch 118 can each be embodied as a diode. As an active switch, first switch 114 and second switch 118 can each be embodied as a transistor and isolator, a transistor and coil, an analog switch, an integrated circuit (herein abbreviated IC), a galvanic (physical) switch and the like. In general, active switches require an input signal which determines if the switch is open (i.e., disconnected such that no current flows through) or closed (i.e., shorted such that current flows through in one direction). It is noted that in one embodiment of the disclosed technique, second switch 118 is embodied within high voltage power supply 116. In this embodiment, high voltage power supply 116 is coupled directly with fast voltage provider 120. In addition, in another embodiment, second switch 118 and fast voltage provider 120 are both embodied within high voltage power supply 116 and therefore high voltage power supply 116 in this embodiment is coupled directly (not shown) with light source 104.

Various embodiments for both fast voltage provider 120 and energy discharger 122 are described below in FIGS. 8A, 8B and 8C. Fast voltage provider 120 can be embodied as an energy bank, as a capacitor charger, as an active component such as a DC/DC power supply and as a current source device. Active switch 106 is shown in FIG. 4 as being coupled with ground terminal 110, which substantially has a voltage of zero volts. Active switch 106 may be embodied as a field-effect transistor (herein abbreviated FET). Active switch 106 receives a signal, i.e. voltage and current, from synchronization controller 108 for being enabled and disabled as described below. Synchronization controller 108 can generally be embodied as a digital component and as such has a low current which is insufficient to enable and disable active switch 106. Switch driver 102 is thus used to amplify current received from synchronization controller 108 in order to provide active switch 106 with sufficient current for enabling and disabling active switch 106. Active switch 106 receives amplified current from switch driver 102 and thus toggles voltage and current between light source 104 and ground terminal 110. When active switch 106 is activated and thus placed in an ON mode, current and voltage from high voltage power supply 116 as well as from low voltage power supply 112 is provided to light source 104 and can flow through light source 104 to ground terminal 110. When active switch 106 is deactivated and thus placed in an OFF mode, current from high voltage power supply 116 and from low voltage power supply 112 is not provided to light source 104; thus current cannot flow through light source 104 to ground terminal 110. In an embodiment where fast voltage provider 120 is embodied as an energy bank, high voltage power supply 116 is used to recharge fast voltage provider 120. Therefore in this embodiment, even when active switch 106 is deactivated, current and voltage can still flow from high voltage power supply 116 via second switch 118 to fast voltage provider 120. The ON mode of active switch 106 substantially allows light source 104 to produce and emit a single light pulse 124 whereas the OFF mode of active switch 106 substantially prevents light source 104 from producing and emitting any light pulses. In another embodiment of pulsed light illuminator 100, active switch 106 is coupled with an element (not shown), and not with ground terminal 110, which has a lower potential than light source 104, low voltage power supply 112 and high voltage power supply 116. In this embodiment, active switch 106 thus serves the same function as in the embodiment shown in FIG. 4, substantially enabling and disabling light source 104 from producing and emitting light pulses but does not need to be coupled to a ground terminal. Synchronization controller 108 controls the activation and deactivation of active switch 106 via switch driver 102, including its timing. Switch driver 102 is used to generate a powerful signal for active switch 106 and to generate the working conditions for active switch 106 to be turned on and off as mentioned above. Synchronization controller 108 may activate active switch 106 on the order of units of nanoseconds or microseconds, thereby enabling light source 104 to produce and maintain light pulses 124 having a pulse width on the order of microseconds or nanoseconds with a rise time and a fall time on the order of nanoseconds. Various embodiments for active switch 106 and its coupling with ground terminal 110 according to the disclosed technique are described below in FIGS. 11A and 11B.

High voltage power supply 116 generates a high voltage and can provide the high voltage via second switch 118 to light source 104. In one embodiment, the generated high voltage is provided via second switch 118 to fast voltage provider 120. Due to the design of pulsed light illuminator 100, a closed electrical circuit wherein current can flow is not formed between high voltage power supply 116 and light source 104 until active switch 106 is activated and placed in an ON mode. In one embodiment, fast voltage provider 120 stores the high voltage provided to it by high voltage power supply 116. In another embodiment, where the fast voltage provider is embodied internally within high voltage power supply 116, the fast voltage provider is enabled to provide high voltage towards light source 104 when active switch 106 is enabled. A low voltage is constantly present on the anode (not shown) of light source 104, which is in the direction of both second switch 118 and/or fast voltage provider 120 (depending on the embodiment) and first switch 114. The cathode (not shown) of light source 104 is in the direction of active switch 106 (i.e., its drain terminal). Whilst active switch 106 is deactivated, the drain terminal of active switch 106 is floating (i.e., disconnected and open) hence the cathode of light source 104 is also floating (i.e., disconnected). No potential difference therefore exists between light source 104 and active switch 106 and thus no current can flow from the fast voltage provider (either embodied within high voltage power supply 116 or as a standalone component) through light source 104 to generate light pulses. In this respect, the high voltage stored on fast voltage provider 120, or available from the fast voltage provider if it is embodied in high voltage power supply 116, is not provided to light source 104. A similar phenomenon is exhibited by low voltage power supply 112. Low voltage power supply 112 generates a low voltage. Due to the design of pulsed light illuminator 100, even though light source 104 may constantly have a low voltage on its anode, current cannot flow from low voltage power supply 112 through light source 104 until active switch 106 is activated and placed in an ON mode. It is noted that both low voltage power supply 112 and high voltage power supply 116 requires a source of energy, such as a DC energy source. In one embodiment of the disclosed technique, both low voltage power supply 112 and high voltage power supply 116 are respectively coupled with external energy sources. For example, in the transportation industry, low voltage power supply 112 might receive energy from a vehicle's battery where high voltage power supply 116 might be coupled with an external energy source mounted under the vehicle's hood. In this embodiment, both power supplies in pulsed light illuminator 100 require an external source of energy. In this embodiment as well, both power supplies can be off-the-shelf components, including being integrated circuits along with supporting peripheral components (not shown) to function properly.

According to another embodiment of the disclosed technique, high voltage power supply 116 is embodied as a voltage multiplier (not shown). In this embodiment, low voltage power supply 112 is coupled with high voltage power supply 116 via dotted line 119. A voltage multiplier is an electrical circuit that can convert lower voltage alternating current (herein abbreviated AC) current to a high voltage DC current and is usually embodied using an array of capacitors (not shown) and diodes (not shown). In this embodiment, high voltage power supply 116 is not embodied as an actual, physical power supply but rather as an electrical circuit and can be considered a "virtual" high voltage power supply. Therefore, only a single external source of energy is required to power low voltage power supply 112. Low voltage power supply 112 thus provides the requisite energy to embody high voltage power supply 116 as a voltage multiplier, thus achieving a source of high voltage power for initiating and terminating a light pulse yet without requiring a second physical power supply. Benefits of this embodiment might include a reduction in weight, cost and size. In addition, off-the-shelf components which are generic, such as off-the-shelf power supplies, might be less energy efficient. In this embodiment, a specific electrical circuit is designed to specific conditions, thereby increasing the efficiency of generating a high voltage current. Furthermore, a specifically designed voltage multiplier might be more reliable than an off-the-shelf integrated circuit fulfilling the same function.

According to various parameters as explained below, synchronization controller 108 provides a signal to switch driver 102 thereby activating active switch 106. Once activated, current can flow through light source 104. Thus fast voltage provider 120 provides its stored or enabled high voltage to light source 104 and low voltage power supply 112 also provides low voltage to light source 104 as current can then flow through light source 104. Due to its greater difference in potential, the high voltage stored on or available from fast voltage provider 120 reaches light source 104 before the low voltage from low voltage power supply 112. As the high voltage and current flow from fast voltage provider 120 and reach light source 104, a light pulse begins to form in light source 104. Fast voltage provider 120 only stores a predefined amount of energy and is quickly dumped. As fast voltage provider 120 substantially completely depletes, the low voltage and current from low voltage power supply 112 begins to reach light source 104, thus enabling light source 104 to maintain the light pulse initially generated by the high voltage stored in or available from fast voltage provider 120. After depletion, the fast voltage provider then begins to be replenished by high voltage power supply 116. Based on various characteristics, parameters or both, as described below, synchronization controller 108 deactivates active switch 106, thus ceasing the flow of current from low voltage power supply 112 to light source 104 and beginning the termination of the so far maintained light pulse. The cessation of power causes a high voltage to remain on light source 104. In general, this high voltage remaining on light source 104 after a light pulse has been generated has an opposite polarity to the high voltage initially provided to light source 104 when the light pulse was initially generated. The high voltage on light source 104 is then transferred to energy discharger 122, substantially dropping the voltage on light source 104 to below the voltage provided by low voltage power supply 112 and terminating the light pulse just generated. It is noted that energy discharger 122 also protects light source 104 from high voltages spikes, whether negative or positive. Energy discharger 122 thus enables any high voltage remaining on light source 104 after active switch 106 has been deactivated to dissipate. In one embodiment of the disclosed technique, energy discharger 122 is an energy dump. In another embodiment of the disclosed technique, energy discharger 122 is coupled with low voltage power supply 112 and allows the energy and current dissipated from light source 104 to be reused in pulsed light illuminator 100 for generating a subsequent light pulse. Such an embodiment may improve the efficiency of pulsed light illuminator 100. In general, since energy discharger 122 can be coupled with a ground terminal (not shown) or to another element (not shown) having a potential which is lower than the voltage of low voltage power supply 112, energy discharger 122 can form a closed electrical circuit for light source 104 for enabling current to flow through light source 104 in an opposite direction even if active switch 106 is in its OFF mode. Once the current flowing through light source 104 drops, a voltage of opposite polarity remains on light source 104 due to parasitic inductance (this is explained further in FIG. 5A). Energy discharger 122 enables the voltage of opposite polarity created by the parasitic inductance to be freed up and thus is designed to enable current to flow from light source 104 through energy discharger 122 only if the voltage on the cathode (not shown) of light source 104 is above a predetermined amount and of a specific polarity. As mentioned above, the high voltage remaining on light source 104 after active switch 106 has been deactivated is usually of the opposite polarity of the high voltage provided by fast voltage provider 120 to light source 104. Thus, energy discharger 122 will enable current on light source 104 to flow through energy discharger 122 only if light source 104 exhibits a high voltage having an opposite polarity as to the polarity of the high voltage initially provided to it by fast voltage provider 120 or high voltage power supply 116. In this respect, energy discharger 122 only forms a closed electrical circuit for current to flow from light source 104 once a light pulse has already been generated and is to be terminated. Specific embodiments for energy discharger 122 are described below in FIGS. 8B and 8C. Once the fast voltage provider has received enough power from high voltage power supply 116, synchronization controller 108 can again activate active switch 106 to generate another light pulse.

As mentioned above, active switch 106 may be embodied as a FET. A field-effect transistor operates by receiving a signal, also known as a gate signal, which enables current to flow from a drain to a source in the FET. Synchronization controller 108 provides the gate signal via switch driver 102 for activating and deactivating active switch 106. As explained above, once active switch 106 is activated, current stored in the fast voltage provider flows through light source 104 and active switch 106 thereby initiating the generation of a light pulse and current is also provided by low voltage power supply 112 via first switch 114 to light source 104 for maintaining the pulse width of the generated light pulse. According to an embodiment of the disclosed technique, synchronization controller 108 is also coupled with low voltage power supply 112, shown via dotted line 121, such that the gate signal provided to active switch 106 is also an enable signal to low voltage power supply 112 to provide low voltage energy towards light source 104. Voltage power supplies usually require a synchronization signal to operate, which can be provided internally or externally. In one embodiment, as described earlier on, low voltage power supply 112 includes an internal synchronization signal for producing low voltage current to be provided to light source 104 via first switch 114. In this embodiment, the synchronization signal provided to low voltage power supply 112 is an external signal coming from synchronization controller 108. A first benefit of this embodiment is that a special oscillator is not needed in the design of low voltage power supply 112 for fulfilling this function (which would be the case if the synchronization signal is provided internally), thus making low voltage power supply 112 more cost effective, smaller, lighter in weight and more reliable. A second benefit is increased safety of pulsed light illuminator 100, as low voltage power supply 112 will remain in an OFF state as long as a gate signal has not been provided to active switch 106. Current from low voltage power supply 112 will only be provided to light source 104 for maintaining a light pulse once current has been provided to active switch 106 for initiating the generation of a light pulse.

As described further below, a fast rise time and fall time of a light pulse is desired by pulsed light illuminator 100 on the order of hundreds or even tens of nanoseconds. According to the disclosed technique, this is achieved via a number of structural, topological and functional changes to an electronic driver. One of these changes is modifying the working point of active switch 106. As mentioned above, active switch 106 may be embodied as a FET and requires a gate signal to enable and disable the flow of current between a drain and a source. Synchronization controller 108 may be embodied as a digital component and may not provide current with enough voltage to activate and deactivate active switch 106. An increase in voltage is thus achieved by using switch driver 102 which amplifies the gate signal, provided by synchronization controller 108, sufficiently to activate and deactivate active switch 106. In general, the difference in voltage received by the active switch may be 12 volts (herein abbreviated V), with 0 V representing active switch 106 being open (i.e., deactivated) and 12 V representing active switch 106 being closed (i.e., activated). The switching point voltage of active switch 106 may be zero volts with switch driver 102 outputting either 0 V or 12 V to activate and deactivate active switch 106 according to signals received from synchronization controller 108. According to one embodiment of the disclosed technique, the switching point voltage can be modified such that it is a negative voltage, for example −3 V. Active switch 106 will then either receive −3 V (i.e., deactivated) or 9 V (i.e., activated) from switch driver 102, thereby keeping the same voltage swing (i.e., voltage difference) for activation and deactivation. However by reducing the deactivation voltage from 0 V down to −3 V, active switch 106 will pass the switching point voltage earlier. This results in a faster deactivation time for active switch 106 and also a faster fall time for light pulse 124. It is noted that the numerical example given above is merely an example and that different switching point voltages can be used to achieve faster deactivation time for active switch 106.

Figure 5A:
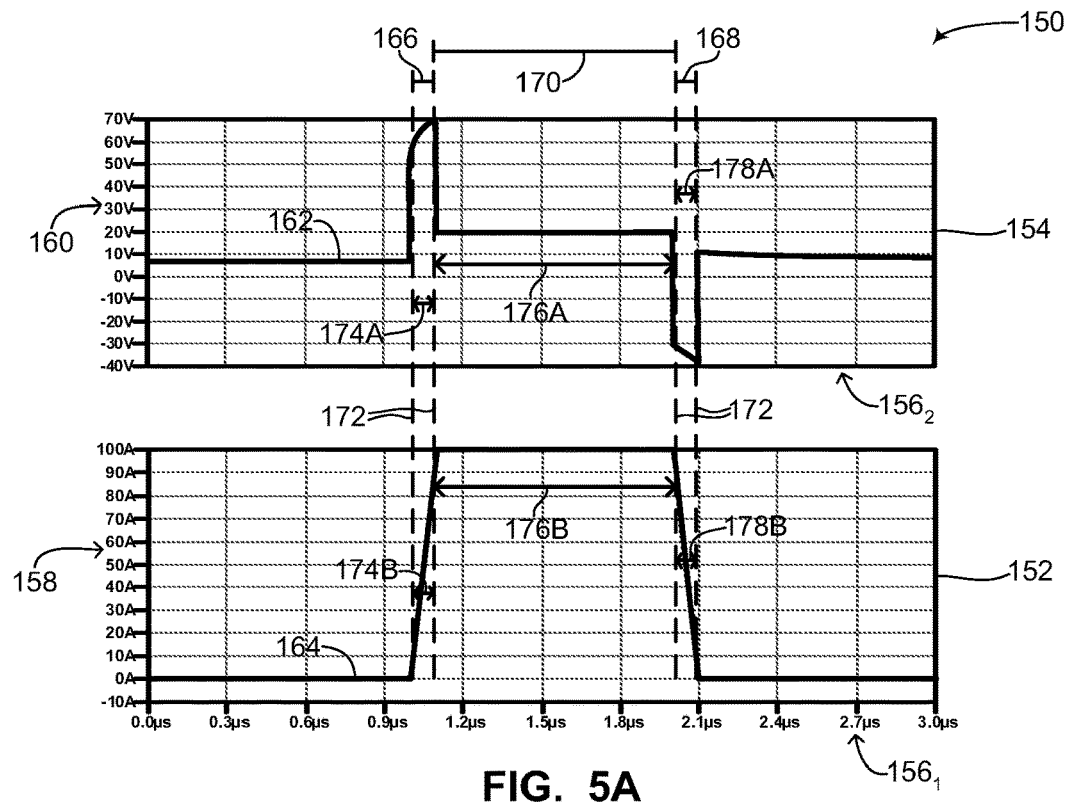
FIG. 5A is a timing diagram illustrating changes in current and voltage for a dual voltage power supply over time for a light source, constructed and operative in accordance with another embodiment of the disclosed technique.

According to the disclosed technique, pulsed light illuminator 100 can generate a light pulse with a fast rise time and achieve a fast fall time while also enabling a substantial pulse width by using two power supplies to provide the requisite energy for generating and maintaining a light pulse. As described above, high voltage power supply 116 is used to generate the rise time of a light pulse, low voltage power supply 112 along with synchronization controller 108 is used to maintain the pulse width of the light pulse and energy discharger 122 is used to initiate the fall time of the light pulse. The operation of the two power supplies in the generation of a light pulse is described in FIG. 5A using a numerical example. Reference is now made to FIG. 5A, which is a timing diagram illustrating changes in current and voltage for a dual voltage power supply over time for a light source, generally referenced 150, constructed and operative in accordance with another embodiment of the disclosed technique. Timing diagram 150 is based on the following numerical example. As an example, suppose that pulsed light illuminator 100 (FIG. 4) is to be mounted on a vehicle and is to image a DOF of approximately 300 meters in front of the vehicle. An optical peak power of about 500 watts per light pulse may be needed to image that distance and DOF, and that might require a current of 100 amperes. Such a current may be achieved using a voltage of approximately 18 volts, thus requiring about 1800 watts of power per light pulse. As mentioned above, a suitable light pulse for imaging should have a fast rise time and fall time, on the order of tens or hundreds of nanoseconds, with a pulse width of approximately one microsecond in order to reflect sufficient light from various DOFs in the range of 300 meters. Timing diagram 150 shows how such a light pulse can be generated given the above requirements using a dual voltage power supply, as embodied in FIG. 4 using two power supplies.

Timing diagram 150 shows two graphs, a first graph 152 and a second graph 154. First graph 152 shows the change in current over time of a light source, such as light source 104 (FIG. 4) whereas second graph 154 shows the change in voltage over time of the light source, such as light source 104. First graph 152 includes an X-axis 156$_1$ representing time in microseconds and a Y-axis 158 representing current in amperes. Second graph 154 includes an X-axis 156$_2$ also representing time in microseconds and a Y-axis 160 representing voltage in volts. First graph 152 and second graph 154 are lined up such that their X-axes 156$_1$ and 156$_2$ coincide and the change over time in current and voltage can thus be seen simultaneously. First graph 152 shows a curve 164 representing the change in current over time whereas second graph 154 shows a curve 162 representing the change in voltage over time. As shown in second graph 154, a constant voltage of approximately 8 volts mirrors a constant current of approximately 0 amperes in first graph 152. A light pulse with a fast rise time is to be generated around 1 microsecond. At approximately 1 microsecond, a high voltage of approximately 70 volts is applied over a time duration of about 100 nanoseconds (from 1.0 to 1.1 μs) as shown in second graph 154. The high voltage causes a relative fast rise time in first graph 152, with the current changing from 0 amperes to 100 amperes, also in about 100 nanoseconds (from 1.0 to 1.1 μs). Once the current is flowing, a lower voltage can be applied to maintain the current level. As shown in second graph 154, a voltage of approximately 20 volts can be applied for approximately 1 microsecond (from 1.1 to 2.0 μs) in order to maintain the current shown in first graph 152 at 100 amperes. In order to terminate the light pulse and achieve a fast fall time, another high voltage, albeit having the opposite polarity, can be applied. As shown in second graph 154, a high negative voltage of approximately −60 volts is applied over a time duration of about 100 nanoseconds (from 2.0 to 2.1 μs), resulting in a reduction of current from 100 amperes to 0 amperes, also in about 100 nanoseconds. The changes in voltage and current in the light source enable a light pulse with the characteristics described above to be generated. It is noted that at the end of the application of the high voltage of opposite polarity for terminating the light pulse, the light source still has a high voltage resting on its cathode. This high voltage can be dissipated by use of an energy discharger, as explained above in FIG. 4.

Timing diagram 150 schematically shows the various sections of a light pulse as reflected in changes in voltage and current in the light source. A rise time 166, a fall time 168 and a pulse width 170 are shown, delineated by a plurality of dotted lines 172. In first graph 152, rise time 166 represents an increase in current, fall time 168 represents a decrease in current and pulse width 170 represents the maintenance of a specific current level. In second graph 154, rise time 166 represents a high voltage of a first polarity (in this case positive), fall time 168 represents a high voltage of a second polarity (in this case negative) and pulse width 170 represents the maintenance of a specific voltage level. Therefore a fast rise time and fall time, on the order of hundreds of nanoseconds, as shown by time durations 174A and 174B (i.e., rise time) and 178A and 178B (i.e., fall time), can be achieved by applying high voltages in a pulsed light illuminator. In order to increase efficiency, once a light pulse has been generated, a lower voltage can be applied to maintain the pulse width of the light pulse, as shown by time durations 176A and 176B (i.e., pulse width). In pulsed light illuminator 100 (FIG. 4), rise time 166 is achieved using high voltage power supply 116 (FIG. 4) and a fast voltage provider (FIG. 4), pulse width 170 is achieved using low voltage power supply 112 (FIG. 4) and synchronization controller 108 (FIG. 4) and fall time 168 is achieved using energy discharger 122 (FIG. 4) and the high voltage of opposite polarity remaining on light source 104 (FIG. 4).

Figure 5B:
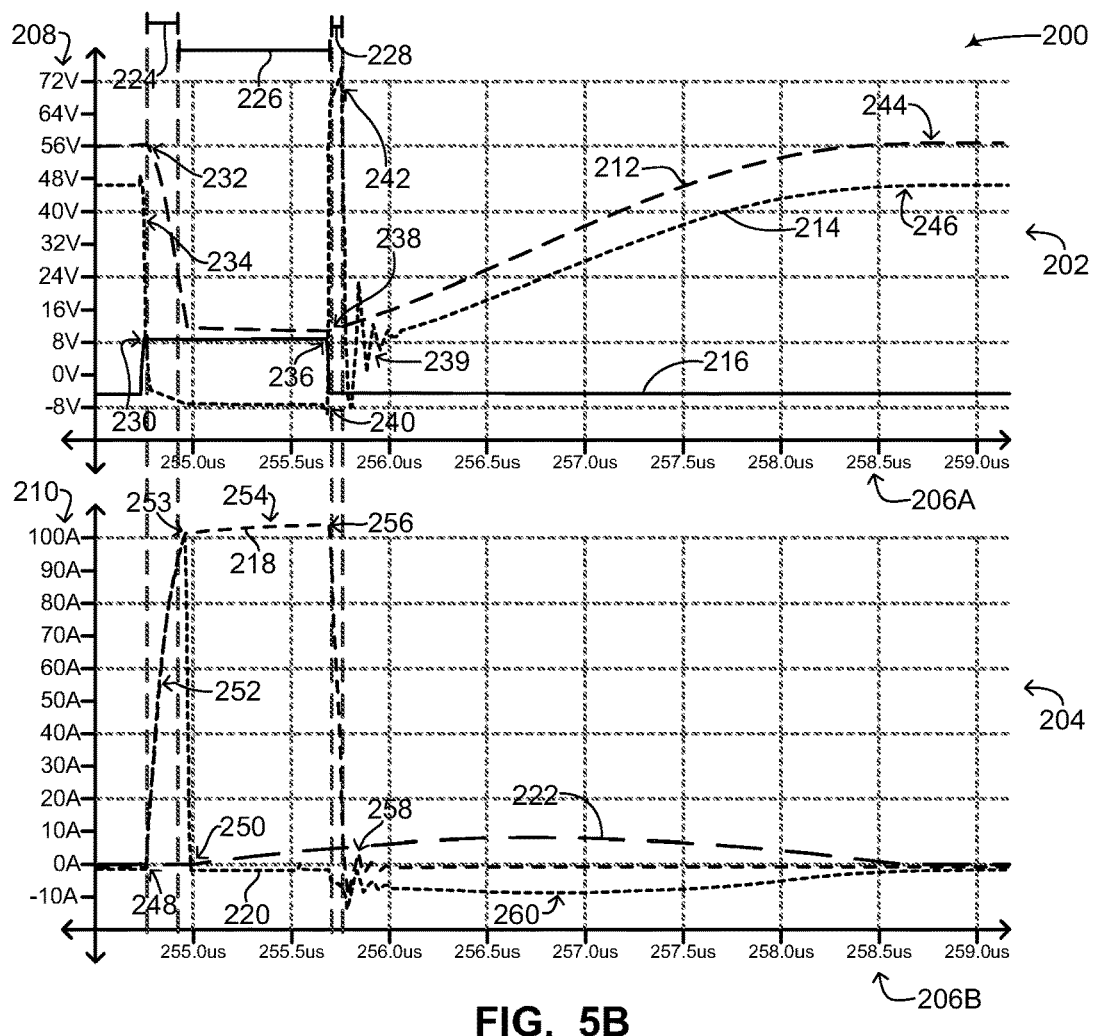
FIG. 5B is a timing diagram illustrating changes in current and voltage for a dual voltage power supply over time for the pulsed light illuminator of FIG. 4, constructed and operative in accordance with a further embodiment of the disclosed technique.

Reference is now made to FIG. 5B, which is a timing diagram illustrating changes in current and voltage for a dual voltage power supply over time for the pulsed light illuminator of FIG. 4, generally referenced 200, constructed and operative in accordance with a further embodiment of the disclosed technique. FIG. 5A was a timing diagram based on a numerical example showing changes in current and voltage over a light source, such as light source 104 (FIG. 4), generating a light pulse. FIG. 5B shows the timing diagram for pulsed light illuminator 100 (FIG. 4), using the same numerical examples in FIG. 5A yet showing the differences in current and voltage for components and elements in electronic driver 101 (FIG. 4). Timing diagram 200 includes two graphs, a first graph 202 showing changes in voltage over time in various components of pulsed light illuminator 100 and a second graph 204 showing changes in current over time in various components of pulsed light illuminator 100. First graph 202 includes an X-axis 206A, representing time in microseconds and a Y-axis 208, representing voltage in volts. Second graph 204 includes an X-axis 206B, representing time in microseconds and a Y-axis 210, representing current in amperes. X-axes 206A and 206B coincide so changes in voltage and current can be seen simultaneously. It is noted that both FIGS. 5A and 5B are based on computer simulations taking into account parasitic inductance in a pulsed light illuminator, for example one designed as per the configuration shown in FIG. 4.

In first graph 202, a curve 212 represents the change in voltage of the anode (not shown) of light source 104 (FIG. 4), a curve 214 represents the change in voltage of the cathode (not shown) of light source 104 and a curve 216 represents the change in voltage of active switch 106 (FIG. 4). In second graph 204, a curve 218 represents the change in current in light source 104, a curve 220 represents the change in current flowing from fast voltage provider 120 (FIG. 4) to light source 104 and a curve 222 represents the change in current flowing from high voltage power supply 116 (FIG. 4) to fast voltage provider 120. The various sections in the generation and maintenance of a light pulse are shown in first graph 202 and second graph 204 as a rise time 224, a pulse width 226 and a fall time 228.

Curve 216 shows the functioning of active switch 106 (FIG. 4) which substantially causes current to flow into light source 104 (FIG. 4) and the generation of a light pulse. At a time point 230, active switch 106 is activated, represented by an increase in voltage, whereas at a time point 236, active switch is deactivated, represented by a decrease in voltage. Time point 230 coincides with the beginning of rise time 224 and time point 236 coincides with the beginning of fall time 228. Once active switch 106 is activated, the voltage resting on the anode of light source 104 flows towards active switch 106 and ground terminal 110 (FIG. 4). This is shown at a time point 232 and represents the fast and significant voltage change in light source 104 which causes a fast rise time and the generation of a light pulse. The voltage resting on the anode of light source 104 comes from fast voltage provider 120 (FIG. 4), which empties quickly once active switch 106 is activated. The voltage of the anode of light source 104 remains low until active switch 106 is deactivated, when at a time point 238 the voltage on fast voltage provider 120 begins to increase as fast voltage provider 120 replenishes itself. This results in an increase in the voltage of the anode of light source 104. After a few microseconds, before the next light pulse is generated, the voltage on the anode of light source 104 returns to its previous level as from before rise time 224, as shown by a time point 244.

Once active switch 106 is activated, the voltage resting on the cathode of light source 104 also flows towards active switch 106 and ground terminal 110 (FIG. 4). This is shown at a time point 234. This voltage remains low until active switch 106 is deactivated, when at a time point 240 the voltage on the cathode of light source 104 suddenly increases. The cessation of flow of current into light source 104 causes the sudden increase in voltage on the cathode of light source 104, thus leaving a high voltage on light source 104, as shown at a time point 242, having an opposite polarity to the voltage provided to the anode of light source 104. As described above, when light source 104 has a high voltage of an opposite polarity to the high voltage initially provided to it, energy discharger 122 (FIG. 4) forms a closed electrical circuit for enabling current to flow and the high voltage on the cathode of light source 104 can be dissipated. The dissipation of the high voltage on the cathode of light source 104 is relatively fast, as shown in first graph 202 and represents the fast fall time of the generated light pulse. As shown, by the end of fall time 228, curve 214 has dipped below the voltage of curve 212, and after a couple of stabilizing oscillations, shown by an arrow 239, the voltage on the cathode of light source 104 begins to slowly rise simultaneously with curve 212, returning to its previous level before the generation of a light pulse, as shown at a time point 246. As mentioned above, fast voltage provider 120 (FIG. 4) and high voltage power supply 116 are used to generate a light pulse with a fast rise time, as shown by curve 212 and energy discharger 122 is used to terminate a light pulse with a fast fall time.

In second graph 204, curve 218 shows the change in current of light source 104 (FIG. 4), which represents the generation of a light pulse. A time point 248, coinciding with the activation of active switch 106 (FIG. 4), shows the beginning of the generation of a light pulse. As shown by an arrow 252, the current flowing through light source 104 increases rapidly from 0 amperes to about 100 amperes in about 100 nanoseconds, as shown by a time point 253. The current flowing through light source 104 is from fast voltage provider 120 (FIG. 4) which depletes quite rapidly, as shown by a time point 250. As shown by an arrow 254, the current flowing through light source 104 is maintained for about one microsecond, thus representing the pulse width of the generated light pulse. The current through light source 104 is maintained by low voltage power supply 112 (FIG. 4) providing voltage to light source 104 (which is not shown in first graph 202). Once active switch 106 (FIG. 4) is deactivated, the current flowing through light source 104 begins to decrease as shown at a time point 256. The fast decrease shown in second graph 204 is due to the current and voltage being dissipated via energy discharger 122 (FIG. 4). The oscillations in voltage on the cathode of light source 104, as shown in first graph 202 by arrow 239, are shown as well as oscillations in current by an arrow 258. The oscillations in current in light source 104 eventually dissipate and the current flowing through light source 104 returns to zero until the next light pulse is generated. As shown by an arrow 260, a "negative" current resides on fast voltage provider 120 (FIG. 4) until its energy store in replenished and ready for generating the next light pulse. The "negative" current is really just current flowing in an opposite direction and represents the fast voltage provider being replenished after it was emptied from the generation of a light pulse. As shown by arrow 260, this current represents current from second switch 118 flowing to fast voltage provider 120 (FIG. 4), since in an actual electrical circuit of pulsed light illuminator 100 (FIG. 4), active switch 106, light source 104 and fast voltage provider 120 are all coupled to the same point.

Figure 2A:
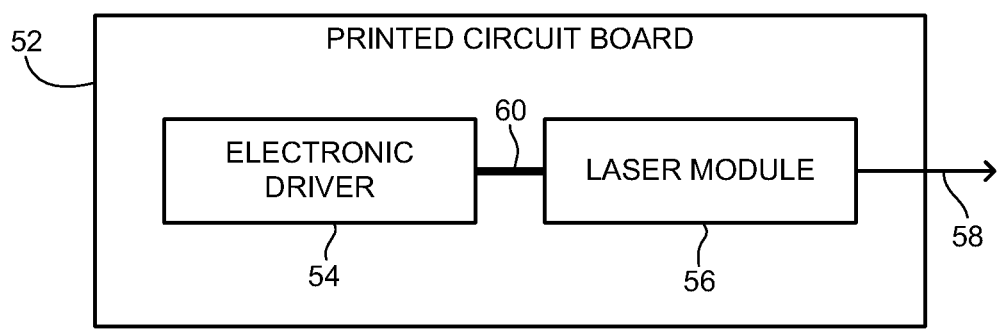
FIG. 2A is a schematic illustration of a pulsed laser for use in a gated imaging system, as is known in the prior art.
Figure 2A:
Figure 2B:
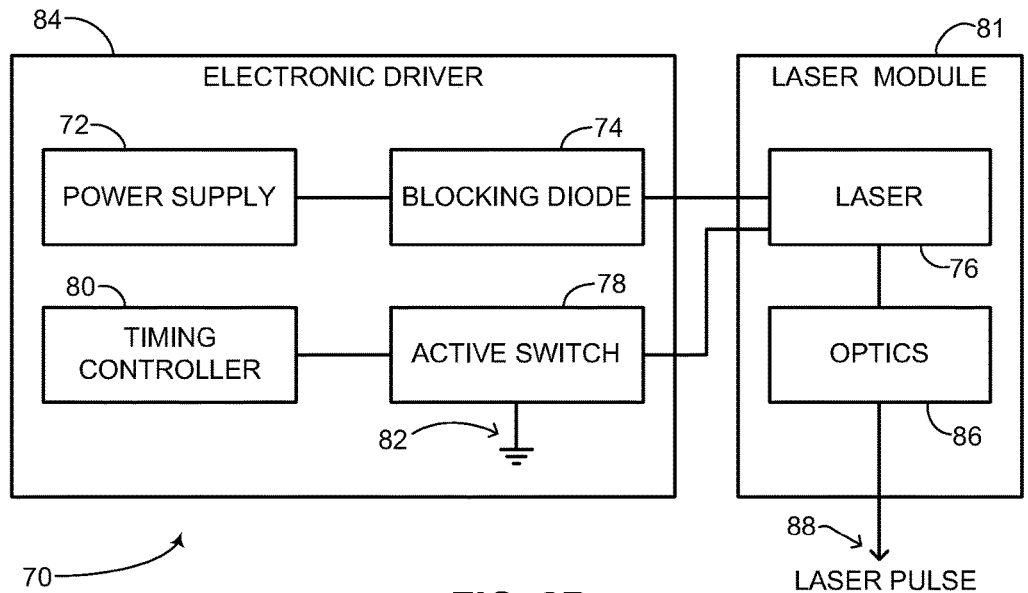
FIG. 2B is a schematic illustration of the pulsed laser of FIG. 2A in greater detail, as is known in the prior art.
Figure 3:
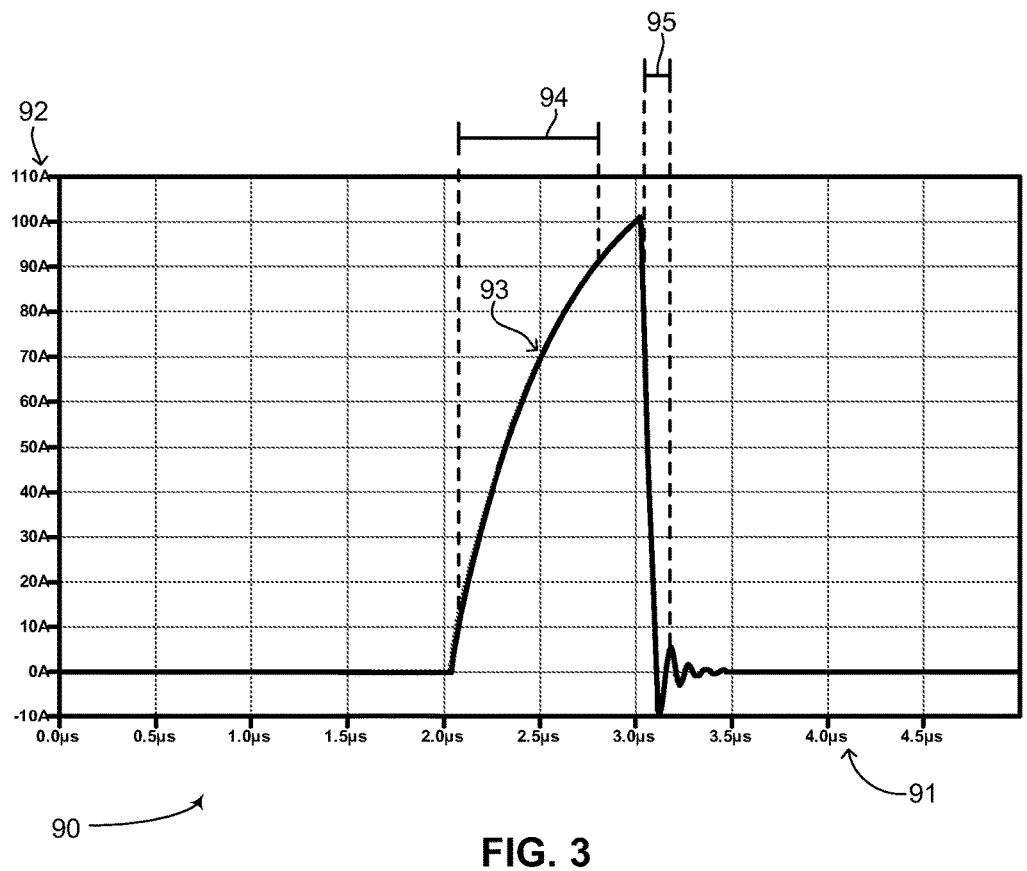
FIG. 3 is a graph illustrating the change in current of a laser pulse over time as generated by the pulsed laser of FIG. 2B, as is known in the prior art.
Figure 6:
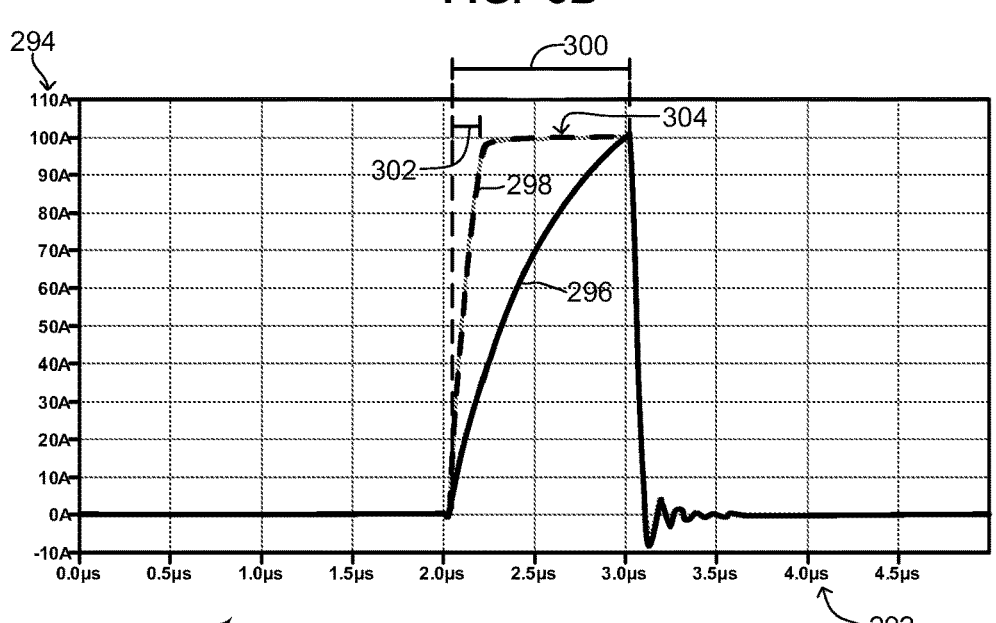
FIG. 6 is a graph illustrating the changes in current of a light source generating a light pulse over time as generated by the pulsed laser of FIG. 2A and the pulsed light illuminator of FIG. 4, constructed and operative in accordance with another embodiment of the disclosed technique.

Reference is now made to FIG. 6, which is a graph illustrating the changes in current of a light source generating a light pulse over time as generated by the pulsed laser of FIG. 2A and the pulsed light illuminator of FIG. 4, generally referenced 290, constructed and operative in accordance with another embodiment of the disclosed technique. A curve 296 represents the change in current of a light source generating a light pulse over time as generated by pulsed laser 50 (FIG. 2A) and is substantially the same as curve 93 (FIG. 3). A curve 298 represents the change in current of a light source generating a light pulse over time as generated by pulsed light illuminator 100 (FIG. 4). It is noted that both curves 296 and 298 show the change in current in response to the exact same input signals and conditions for a square-shaped pulsed having a pulse width of approximately 1 microsecond. Curve 296 represents the change in current generated by pulsed laser 50 whereas curve 298 represents the change in current generated by pulsed light illuminator 100. Thus curves 296 and 298 have no connection to one another other than having been generated using the same conditions. A rise time 302 of curve 298 and a pulse width 304 of curve 298 are shown along with the duration of both curve 296 and 298 from the beginning of a rise time to the start of a fall time as shown by a time duration 300. As seen, the light pulse generated by pulsed light illuminator 100 has a fast rise time, a substantially stable and constant pulse width of approximately one microsecond and a fast fall time. The light pulse generated by pulsed laser 50 has comparatively a slow rise time, almost no pulse width which is stable and constant and a fast fall time. In addition, curve 298 represents a light pulse with a substantial time duration of full optical peak power (i.e., for the duration of pulse width 304) whereas curve 296 represents a light pulse lacking in full optical peak power. In FIG. 6, the area under each curve (i.e., the integral of each curve) represents the optical peak power generated. For a relatively long pulse (not shown in FIG. 6), such as 10 microseconds at a current of 100 amperes, there would not be much difference in optical peak power between a light pulse generated by pulsed laser 50 having a slower rise time and pulsed light illuminator 100 having a faster rise time over an interval of 1 microsecond. However, for a relatively short pulse, such as 1 microsecond pulse as shown in FIG. 6, a slow rise time versus a fast rise time makes a significant difference in area under the curve and thus in optical peak power. Curve 298 encompasses substantially more area than curve 296 and thus represents a light pulse having substantially more optical peak power. Higher optical peak power is directly related to an increase in DOF which can be imaged by a pulsed light illuminator. Light pulses as generated by pulsed light illuminator 100 according to the disclosed technique thereby meet the requirements and characteristics as described above for use in a gated imaging system, for example in the transportation industry.

Reference is now made back to FIG. 4, to which further explanations can now be given based on the explanations given above in FIGS. 5A and 5B. In one embodiment, high voltage power supply 116 provides power to fast voltage provider 120 via second switch 118. Fast voltage provider 120 has a predetermined storage capacity and thus stores high voltage energy to be used in generating a light pulse. Fast voltage provider 120 can replenish its energy store on the order of hundreds of nanoseconds and in general should be able to replenish its energy store faster than the period of a light pulse. As mentioned above, the fast voltage provider may also be embodied internally within second switch 118 or high voltage power supply 116. Either way, the function of the fast voltage provider is to be able to provide high voltage energy quickly and rapidly to light source 104 faster than the period of a light pulse. As fast voltage provider 120 is coupled with light source 104, the high voltage on fast voltage provider 120 is transferred to light source 104. Thus before a trigger or gate signal from synchronization controller 108 is generated, light source 104 may have a high voltage even though that voltage cannot be used to generate a light pulse since no current is flowing through light source 104. The generation of a light pulse by light source 104 is thereby the result of a signal from synchronization controller 108, via switch driver 102 to active switch 106. Second switch 118 prevents any backflow of the current on fast voltage provider 120 to high voltage power supply 116, which could damage or destroy high voltage power supply 116. Likewise, low voltage power supply 112 provides a voltage to light source 104 however since it is lower than the voltage provided by high voltage power supply 116, it is as if light source 104 is oblivious to that voltage. First switch 114 prevents any high voltage spikes as well as the constant high voltage generated by high voltage power supply 116 from reaching low voltage power supply 112 as well as any current backflow from fast voltage provider 120 to low voltage power supply 112. When active switch 106 is activated, both the fast voltage provider and low voltage power supply 112 provide voltage to light source 104. However since the potential difference coming from the fast voltage provider is greater than the potential difference coming from low voltage power supply 112, the current in the fast voltage provider that is transferred to light source 104 is more dominant. This transfer of current causes a significantly fast rise time on light source 104 which generates correspondingly light pulse 124. Current is simultaneously being provided to light source 104 from low voltage power supply 112 however initially this current is less dominant. The fast voltage provider 120 has a limited storage capacity for providing high voltage energy quickly and as such, it is depleted quite quickly. Once depleted, the lower voltage power from low voltage power supply 112 continuously flows into light source 104, enabling the generated light pulse to continue into its pulse width. Thus a lower voltage can be used to maintain the current light pulse. Once depleted, fast voltage provider 120 slowly begins to replenish, as was shown above in first graph 202 (FIG. 5B) and second graph 204 (FIG. 5B). When active switch 106 is deactivated, current ceases to flow through light source 104 and a large potential difference remains on the cathode (not shown) of light source 104, giving light source 104 a high voltage of opposite polarity to the polarity of the power supplied to it by fast voltage provider 120. At this point, energy discharger 122 becomes active and enables the high voltage of opposite polarity to dissipate, thus resulting in a fast fall time for light pulse 124.

Reference is now made to FIG. 7, which is a diagram illustrating differences in current response over time as a function of current in a light pulse, generally referenced 320, constructed and operative in accordance with a further embodiment of the disclosed technique. In FIG. 7, the same input is given to a pulsed light illuminator, however the voltages used are different which result in a different current response. As described below, the pulse width of the generated light pulse is substantially the same in each graph whereas the rise time and fall time are different. As mentioned above, one of the constraints of the disclosed technique is cost effectiveness while maintaining certain requirements in the generated light pulse. According to the disclosed technique, cost effectiveness can be increased while maintaining certain requirements in the generated light pulse by increasing the working voltage of both high voltage power supply 116 (FIG. 4) and low voltage power supply 112 (FIG. 4). It is noted that in this respect, a change in working voltage for both high voltage power supply 116 and low voltage power supply 112 requires other components in pulsed light illuminator 100 (FIG. 4), such as light source 104 (FIG. 4), active switch 106 (FIG. 4), fast voltage provider 120 (FIG. 4) and energy discharger 122 (FIG. 4) to be appropriately designed to handle the selected working voltage. According to the disclosed technique, this enables lower current in light source 104 (FIG. 4) while not compromising on the characteristics of light pulse 124 (FIG. 4), meaning the current driven and passed through by switch driver 102 (FIG. 4) can be lowered. Lower current requirements of light source 104 allows for more cost effective parts in constructing pulsed light illuminator 100 (FIG. 4). This is shown schematically in diagram 320 which shows three graphs 322A, 322B and 322C. Each one of graphs 322A-322C shares a common X-axis 324 showing time in microseconds. The Y-axes 326A-326C of graphs 322A-322C each show current in amperes albeit in different scales. Graph 322A shows a scale in current spanning approximately 260 amperes, graph 322B shows a scale in current spanning approximately 110 amperes and graph 322C shows a scale in current spanning approximately 60 amperes. In graphs 322A, 322B and 322C, curves 328A, 328B and 328C respectively represent changes in current on a light source (such as light source 104 in FIG. 4) during the generation of a light pulse, which is influenced by a high voltage power supply and a low voltage power supply, such as respectively high voltage power supply 116 and low voltage power supply 112, both in FIG. 4. Curves 330A, 330B and 330C respectively represent changes in current on a light source (such as light source 104) and in a lower voltage power supply, such as low voltage power supply 112 when current on the light source is discharged at the termination of the light pulse (such as via energy discharger 122 in FIG. 4). The main differences in each of graphs 322A-322C are the amount of current present in a light source for generating a light pulse, as shown respectively by points 332A-332C and the time duration current is transferred from the high voltage power supply to a fast voltage provider and then to the light source, as shown respectively by arrows 334A-334C. Arrows 334A-334C represent energy loss as well as rise time/fall time performance. As shown, a lower working current in graph 322C results in better efficiency as well as less heat loss. Each of graphs 322A-322C represents a generated light pulse having an optical peak power of approximately 500 watts. However, graph 322A, which was generated by a low working voltage (not shown), results in a high current light pulse with a large energy loss on the high voltage power supply. Graph 322B, which was generated by a higher working voltage (not shown) results in a lower current light pulse with a moderate energy loss on the high voltage power supply. Graph 322C, which was generated by the highest working voltage (not shown), results in the lowest current light pulse with the smallest energy loss on the high voltage power supply. Thus according to the disclosed technique, an appropriate optical peak power can be achieved for a generated light pulse meeting the requirements described above, while also curtailing energy losses by increasing the working voltage of the power supplies in the pulsed light illuminator of the disclosed technique thus enabling a lower working current in a light source by a switch driver. In the prior art, the operating voltage of a laser is usually defined by the lasing material, and if a high energy pulse is desired then a higher current is simply used. In the disclosed technique, the operating voltage is increased in order to decrease the current while still maintaining and achieving a high energy pulse.

Reference is now made to FIG. 8A, which is a schematic illustration of a first embodiment of the fast voltage provider of the pulsed light illuminator of FIG. 4, generally referenced 360, constructed and operative in accordance with another embodiment of the disclosed technique. Fast voltage provider 360 represents one embodiment of fast voltage provider 120 (FIG. 4). Fast voltage provider 360 is an embodiment of an energy bank and includes an inductor 364 and a capacitor 366. Inductor 364 is coupled with a switch 368, which is substantially similar to second switch 118 (FIG. 4) and capacitor 366. In another embodiment, inductor 364 can be replaced with a resistor. In general, other known electronic components can be used instead of inductor 364. Capacitor 366 is coupled with a light source 370, which is substantially similar to light source 104 (FIG. 4). Inductor 364 may be a charging inductor and capacitor 366 may be an acceleration capacitor or other kind of capacitor. Capacitor 366 stores high voltage energy supplied to it via inductor 364 from a high voltage power supply (not shown). Inductor 364 enables voltage to oscillate between capacitor 366 and inductor 364. When a current is provided to light source 370, capacitor 366 discharges its stored energy towards light source 370 and then begins to store charge again from the high voltage power supply. In addition, inductor 364 and switch 368 form a current switch. When an active switch (not shown) coupled with light source 370 is activated, fast voltage provider 360 immediately transfers energy to light source 370. A high voltage power supply (not shown) coupled with switch 368 might then be shorted to light source 370 and then directly to a ground terminal (not shown) coupled with light source 370. The high voltage power supply might be coupled directly with another switch (not shown) before being coupled with switch 368 which is part of fast voltage provider 360. Thus according to the disclosed technique, the presence of inductor 364 acts as a current stopper preventing the high voltage power supply from being shorted through light source 370.

Reference is now made to FIG. 8B, which is a schematic illustration of a first embodiment of the energy discharger of the pulsed light illuminator of FIG. 4, generally referenced 380, constructed and operative in accordance with a further embodiment of the disclosed technique. Energy discharger 380 is an embodiment of energy discharger 122 (FIG. 4). FIG. 8B shows an energy discharger 382, including two diodes 384A and 384B. Diode 384B is coupled with a light source 386, which is substantially similar to light source 104 (FIG. 4). Diode 384A is coupled with diode 384B on one side. On the other side, diode 384A may be coupled with a ground terminal (not shown). In another embodiment, the other side of diode 384A is coupled with an element having a voltage less than the voltage of a low voltage power supply, such as low voltage power supply 112 (FIG. 4).

Reference is now made to FIG. 8C, which is a schematic illustration of a second embodiment of the energy discharger of the pulsed light illuminator of FIG. 4, generally referenced 390, constructed and operative in accordance with a further embodiment of the disclosed technique. Energy discharger 390 is an embodiment of energy discharger 122 (FIG. 4). FIG. 8C shows an energy discharger 392, a Zener diode 398 and a capacitor 399. On one side Zener diode 398 is coupled with a light source 394, which is substantially similar to light source 104 (FIG. 4). On the other side, Zener diode 398 may be coupled with a ground terminal (not shown). In another embodiment, the other side of Zener diode 398 is coupled with an element having a voltage less than the voltage of a low voltage power supply, such as low voltage power supply 112 (FIG. 4). Capacitor 399 is coupled on either side of Zener diode 398. As shown, energy discharger 390 is coupled in parallel with light source 394. Zener diode 398 substantially acts as a limiter in energy discharger 390, not enabling current to pass through it until a specific peak voltage is reached. The peak voltage may be the breakdown voltage of Zener diode 398. If the voltage on the cathode (not shown) of light source 394 is higher than the peak voltage of Zener diode 398, then Zener diode 398 will enable current to pass through it. In this respect, energy discharger 390 only enables current to pass through it when light source 394 has a higher voltage on its cathode (i.e., as compared to its anode), thus discharging light source 394 of any residual high voltage remaining on it after a light pulse is emitted. It is noted that Zener diode 398 may be replaced by any other type of known diode.

Figure 9A:
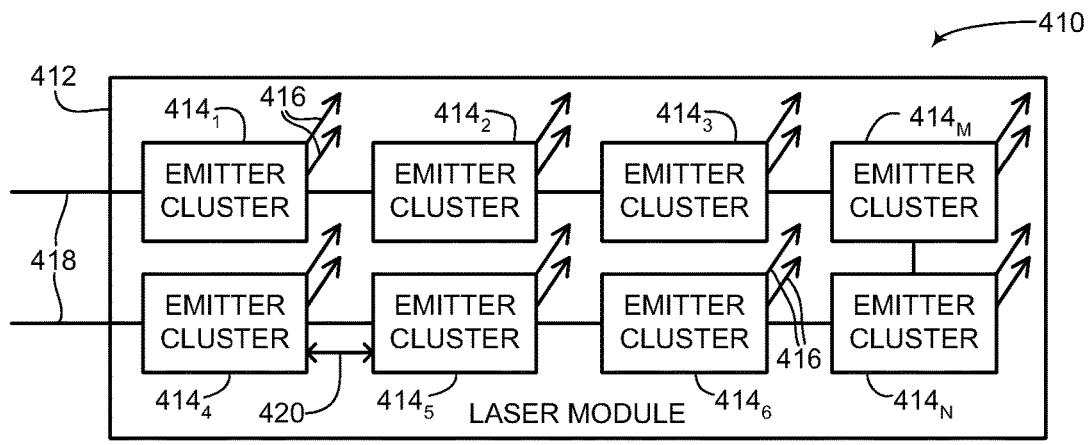
FIG. 9A is a schematic illustration of a laser module comprising emitter clusters, as is known in the prior art.

Reference is now made to FIG. 9A, which is a schematic illustration of a laser module comprising emitter clusters, generally referenced 410, as is known in the prior art. Laser module 410 may be housed on a PCB 412 and includes a plurality of emitting clusters $414_1$, $414_2$, $414_3$ and $414_M$ and a plurality of parallel emitting clusters $414_4$, $414_5$, $414_6$ and $414_N$. Plurality of emitting clusters $414_1$, $414_2$, $414_3$ and $414_M$ are coupled in series, as shown in FIG. 9A. Plurality of parallel emitting clusters $414_4$, $414_5$, $414_6$ and $414_N$ are also coupled in series, as shown in FIG. 9A. The final emitting cluster in each plurality of emitting clusters, i.e., emitting cluster $414_M$ and emitting cluster $414_N$, are coupled with each other in series. Each emitting cluster includes parallel emitters which emit light when provided with current, as shown by a plurality of arrows 416. The initial emitting cluster in each plurality of emitting clusters, i.e., emitting cluster $414_1$ and emitting cluster $414_4$, are coupled with an electronic driver (not shown) for receiving a drive current (not shown) via a connection 418. The laser module design shown in FIG. 9A is known in the art. Based on the known equation $$P = I \cdot V \quad (1)$$

where P is power in watts, I is current or intensity in amperes and V is voltage is volts, the power achievable by laser module 410 is a function of the voltage achievable by each emitting cluster.

Figure 9B:
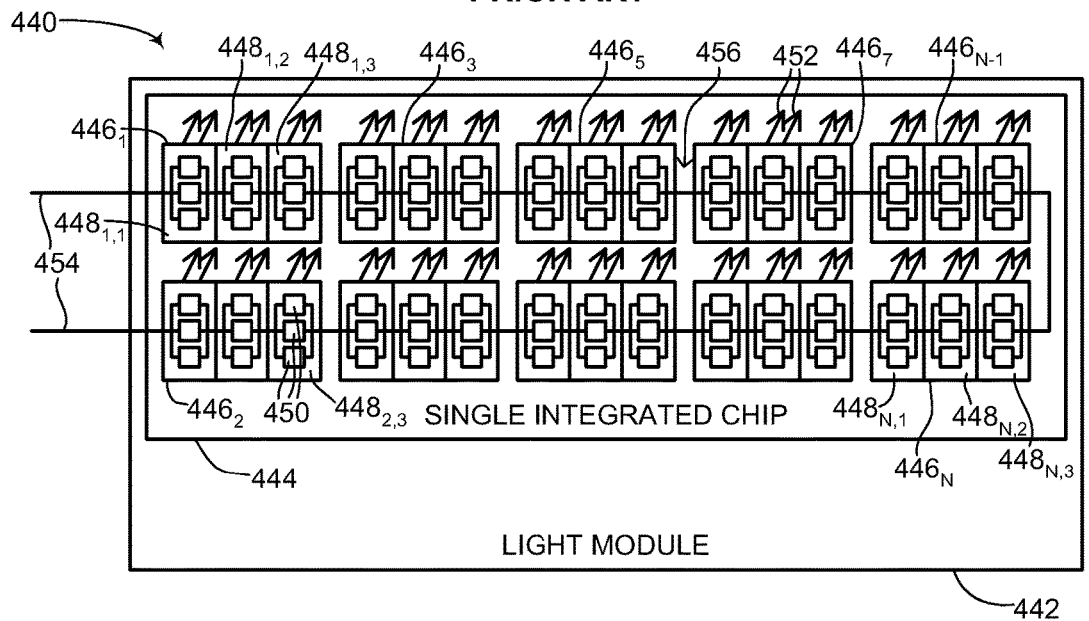
FIG. 9B is a schematic illustration of a laser module comprising emitter clusters on a single integrated chip, constructed and operative in accordance with a further embodiment of the disclosed technique.

There is a desire according to the disclosed technique to increase the voltage achievable by each emitting cluster while maintaining substantially the same optical peak power and while also being cost effective. This can be achieved as mentioned above in the disclosed technique by reducing the working current. A light module design embodying such a design is described below in FIG. 9B. Reference is now made to FIG. 9B, which is a schematic illustration of a light module comprising emitter clusters on a single integrated chip, generally referenced 440, constructed and operative in accordance with a further embodiment of the disclosed technique. Light module 440 is housed on a PCB 442. Light module 440 may also be housed on a separate plate (not shown) or PCB. Within PCB 442, all the emitting clusters are positioned on a single integrated chip (herein abbreviated IC) 444. Single IC 444 enables a light module to be built while also increasing its cost effectiveness as the cost of handling, packing and dicing the single IC is reduced. Light module 440 includes a plurality of emitting clusters $446_1$, $446_2$, $446_N$. As shown, emitting clusters $446_1$, $446_3$, $446_5$, $446_7$ and $446_{N-1}$ are parallel to emitting clusters $446_2$ and $446_N$, with emitting clusters $446_1$, $446_2$, $446_N$ being coupled with each other in series. However unlike laser module 410 (FIG. 9A), each emitting cluster includes a plurality of sub-clusters which are coupled in parallel. For example, emitting cluster $446_1$ includes a first sub-cluster $448_{1,1}$, a second sub-cluster $448_{1,2}$ and a third sub-cluster $448_{1,3}$. Each sub-cluster includes a plurality of vertical-cavity surface-emitting lasers (herein abbreviated VCSELs) 450 (as shown in emitting cluster $446_2$ in sub-cluster $448_{2,3}$). Plurality of VCSELs 450 is coupled in parallel and each generates light pulses, as shown schematically by a plurality of arrows 452.

As shown in FIG. 9B, each one of plurality of VCSELs 450 is configured on single IC 444. Sub-clusters (for example, emitting clusters $446_1$, $446_3$ and $446_{N-1}$) of plurality of VCSELs 450 are coupled in series, whereas within each sub-cluster, a portion of the VCSELs are coupled in parallel, as shown in emitting cluster $446_N$ for example. The parallel coupling of the plurality of VCSELs within each sub-cluster is done on the die level of single IC 444. This enables the VCSELs to be placed closer together, as shown by an arrow 456. Compare this to an arrow 420 in FIG. 9A which shows a greater distance between emitting clusters. By reducing the physical distance between emitting clusters, power losses can be lowered, thus improving efficiency in light module 440 and in the transfer of current to and from a switch driver (not shown), as shown via a connection 454. As described above, the physical length of connection 60 (FIG. 2A) is inversely related to the efficiency of pulsed laser 50 (FIG. 2A). In FIG. 9B, by reducing the physical length between connections, such as shown by arrow 456, a more efficient light module is achieved. In addition, the reduction in distance between the emitting clusters enables an improvement in cost efficiency since single IC 444 will have an overall smaller die area. Furthermore, the reduction in distance enables an improvement in reliability in single IC 444 as fewer connections will be needed between sub-clusters. The reduction in distance as shown by arrow 456 results in a reduction in parasitic inductance, thus resulting in improved efficiency in light module 440. The improvement in efficiency enables an even lower current to be used in generating the requisite light pulses as there is less voltage loss within light module 440. The reduction in distance as shown by arrow 456 also enables improvements in manufacturing light module 440 as fewer elements need to be handled and coupled externally, thereby making assembly most cost effective and easier to work with. The reduced parasitic inductance also enables a faster response time to changes in current, thereby enabling significantly shorter rise and falls times to be achieved in the light pulses generated by light module 440.

Figure 10:
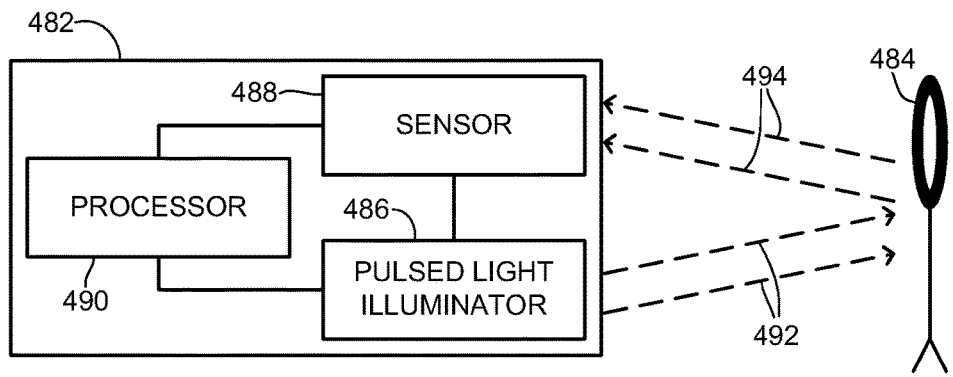
FIG. 10 is a schematic illustration of a gated imaging system comprising the pulsed light illuminator of FIG. 4, constructed and operative in accordance with another embodiment of the disclosed technique.

Reference is now made to FIG. 10, which is a schematic illustration of a gated imaging system comprising the pulsed light illuminator of FIG. 4, generally referenced 480, constructed and operative in accordance with another embodiment of the disclosed technique. Gated imaging system 480 includes a pulsed light illuminator 486, a sensor 488 and a processor 490. Pulsed light illuminator 486, sensor 488 and processor 490 may be encapsulated in a housing 482. Pulsed light illuminator 486 is substantially similar to pulsed light illuminator 100 (FIG. 4). Sensor 488 is coupled with processor 490 and pulsed light illuminator 486. Processor 490 is also coupled with pulsed light illuminator 486. Gated imaging system 480 is used to image an object 484 which is situated in front of gated imaging system 480.

Pulsed light illuminator 486 generates and emits a plurality of light pulses 492 towards a scene of observation (not labeled) or an object, such as object 484. A portion of plurality of light pulses 492 may reflect off of object 484 back towards sensor 488, as shown by a plurality arrows 494. The reflected light pulses are sensed by sensor 488 and provided to processor 490 for processing. The processing may generate an image of object 484 or may derive other information about object 484 based on the characteristics of the reflected light pulses. For example, processor 490 may generate a signal representative of object 484 based on the reflected light pulses.

Gated imaging system 480 can be used as a low visibility vision system for increasing the visibility of a user in a variety of weather conditions. Pulsed light illuminator 486 can generate light pulses in a variety of spectrums, including the visible spectrum and the infrared spectrum. In particular, pulsed light illuminator 486 may generate light pulses in the near infrared (herein abbreviated NIR) spectrum, which ranges from around 700 nanometers to about 1100 nanometers or in the short wave infrared (herein abbreviated SWIR) spectrum, which ranges from around 1100 nanometers to about 2200 nanometers. Light pulses in the NIR or SWIR spectrums are substantially invisible to the human eye and are also not affected by climactic conditions. Therefore light pulses in such a spectrum can be used to generate images in inclement weather, such as rain, fog, snow, hail and in the absence of sunlight, for example in a dark tunnel or at nighttime.

Sensor 488 and pulsed light illuminator 486 need to be synchronized in terms of their respective functioning and timing in order that sensor 488 can produce useful and clear representations of a scene of observation or an object based on reflected light pulses from the scene of observation or the object. In one embodiment of the disclosed technique, the synchronization controller (not shown) in pulsed light illuminator 486 controls the timing of sensor 488. Therefore once pulsed light illuminator 486 emits light pulses 492, the synchronization controller controls when sensor 488 should start and stop sensing reflections from object 484 based on the amount of time it would take a light pulse to travel and reflect from an object in a scene of observation distanced within a predetermined range or DOF, for example 300 meters. In another embodiment of the disclosed technique, sensor 488 controls the timing of the synchronization sensor. In this embodiment, sensor 488 determines when the active switch (not shown) of pulsed light illuminator 486 is activated, thereby determining when light pulses 492 are emitted. It is noted that that sensor 488 substantially has two states, an open state for receiving photons from reflections and a closed state when no photons are detected. However, the open and closed states of sensor 488 are not absolute, and the open state of sensor 488 can include a shutter (not shown) of sensor 488 being partially open and the closed state of sensor 488 can include the shutter of sensor 488 being partially closed.

It is further noted that feedback from sensor 488 can be used to adjust various parameters of pulsed light illuminator 486. For example, the intensity of reflected light pulses 494 may be used to modify the pulse width of light pulses 492, the number of light pulses 492 generated and emitted in a given time interval (i.e., the pulse repetition rate, also abbreviated PRR) or both. Also, as described below, if gated imaging system 480 is mounted on a moving platform, then according to the disclosed technique the peak power of light pulses 492 may be controllable or changeable as a function of the speed of the moving platform or the location scene location of the moving platform, such as an urban scene or a country scene.

Reference is now made back to FIG. 4. Synchronization controller 108 substantially controls the timing of when light pulse 124 is emitted by controlling when active switch 106 is activated and deactivated. As mentioned in FIG. 10, synchronization controller 108 may be coupled with an external sensor, such as sensor 488 (FIG. 10), which senses reflections of emitted light pulses from at least one object in front of pulsed light illuminator 100. Synchronization controller 108 can be coupled with this external sensor via wired communication (such as an Ethernet connection, standard electrical cabling, coaxial cabling and the like), wireless communication (such as a Wi-Fi connection, a Bluetooth® connection and the like), half duplex communication, optical communication (such as via optical fibers) and the like. In this respect pulsed light illuminator 100 and the external sensor do not need to be physically close to one another and in a gated imaging system can be mounted in different locations some distance apart, such as a few meters apart.

As mentioned above in FIG. 10, pulsed light illuminator 100 can be used in a gated imaging system. The pulsed light illuminator of the disclosed technique can also be in other systems, for example in a portable camera, such as in a mobile or cellular telephone. Another use for such a gated imaging system is when pulsed light illuminator 100 is mounted on a moving platform. In this respect, pulsed light illuminator 100 can be used in a gated imaging system for improving visibility from a moving platform such as a vehicle, a transportation element, a robot and an aircraft. A vehicle can include a land vehicle, a sea vehicle and a space vehicle. Land vehicles can include a car, a motorcycle, a truck and a train, as well as autonomous and non-autonomous vehicles. Aircraft can include fixed-wing aircraft as well as rotary-wing aircraft such as helicopters. Another use for such a gated imaging system is when pulsed light illuminator 100 is mounted on a stationary platform. In this respect, pulsed light illuminator 100 can be used in a gated imaging system for improving visibility from a stationary platform such as in a surveillance system or security monitoring system. The light source of such a pulsed light illuminator can illuminate a scene in front of the pulsed light illuminator, behind the pulsed light illuminator or may be mounted on a rotatable shaft such that the scene 360° around the pulsed light illuminator is illuminated by the light source. Also the pulsed light illuminator may be a single standalone unit or it may be integrated into a preexisting light source in the vehicle, such as a headlamp, fog lamp and the like. Furthermore, the pulsed light illuminator of the disclosed technique can be divided up into a plurality of sub-units which are coupled with each other, either wired or wirelessly.

Light source 104 may generate light pulses having a wavelength in the NIR or SWIR spectrums. In another embodiment of the disclosed technique, if pulsed light illuminator 100 is mounted on a moving platform, then high voltage power supply 116 and low voltage power supply 112 may include a circuit (not shown) for varying the current it provides light source 104 according to a velocity of the moving platform. The circuit for varying the current may also be embodied as part of light source 104. The current provided by the fast voltage provider to light source 104 substantially determines the rise time of light pulse 124 whereas the current and voltage provided by high voltage power supply 116 and low voltage power supply 112 substantially determines the optical peak power of light pulse 124. This may be important especially when the moving platform is a land vehicle or sea vehicle and light source 104 is emitting light pulses in the infrared spectrum and in places where humans and animals frequent. It is noted that the pulse width may be determined by synchronization controller 108, sensor 488 or an external unit (not shown). The circuit may be an analog circuit, a digital circuit, an analog processor or a digital processor. In general, the circuit may vary the current, which substantially determines the intensity of the light pulses emitted by light source 104, by decreasing the current as the velocity of the moving platform decreases and increasing the current as the velocity of the moving platform increases. The change in current can thus be effected to keep the optical power density of the light pulses emitted by light source 104 within an eye-safe level. The change in current from high voltage power supply 116 and low voltage power supply 112 can also be effected to keep the optical peak power and the average power density of the light pulses emitted by light source 104 within a skin-safe level. It is noted as well that the average power density of the light pulses can also be modified by varying other parameters related to light pulse 124 such as its pulse width as well as the number of pulses generated per given time interval.

In an embodiment of the disclosed technique where pulsed light illuminator 100 is mounted on a vehicle, such as a car, motorcycle or truck, pulsed light illuminator 100 may be integrated into a light source of the vehicle. For example, pulsed light illuminator 100 may be integrated into the headlamp, fog lamp, lateral lamp or rear lamp of the vehicle. In either case, if pulsed light illuminator 100 is integrated into a light source of the vehicle and emits light pulses in the NIR spectrum, such light pulses may be partially visible to humans and can be distracting in a moving vehicle to others. In such an embodiment pulsed light illuminator 100 may include an additional light source (not shown), for masking the light pulses generated by light source 104 in the NIR spectrum. The additional light source may be, for example, an LED, a vehicle headlamp and the like.

It is noted that pulsed light illuminator 100 can be used as part of a gated imaging system even in daylight where visibility is normally high. In particular, pulsed light illuminator 100 can be used to illuminate objects which are retroreflectors and thereby reflect light at a higher intensity than other objects. Pulsed light illuminator 100 can also be used to generate light pulses with a short pulse width to image diffusive objects in daylight. According to another embodiment of the disclosed technique, the field of illumination of light source 104 can be modified according to various different parameters, depending on the use of pulsed light illuminator 100. For example, the field of illumination of light source 104 can be modified based upon a velocity of a moving platform or an angular momentum of the moving platform if pulsed light illuminator 100 is mounted on a moving platform. The field of illumination can also be modified depending on a type of scenery pulsed light illuminator 100 is used to illuminate or a weather condition in which pulsed light illuminator 100 is used in.

Figure 11A:
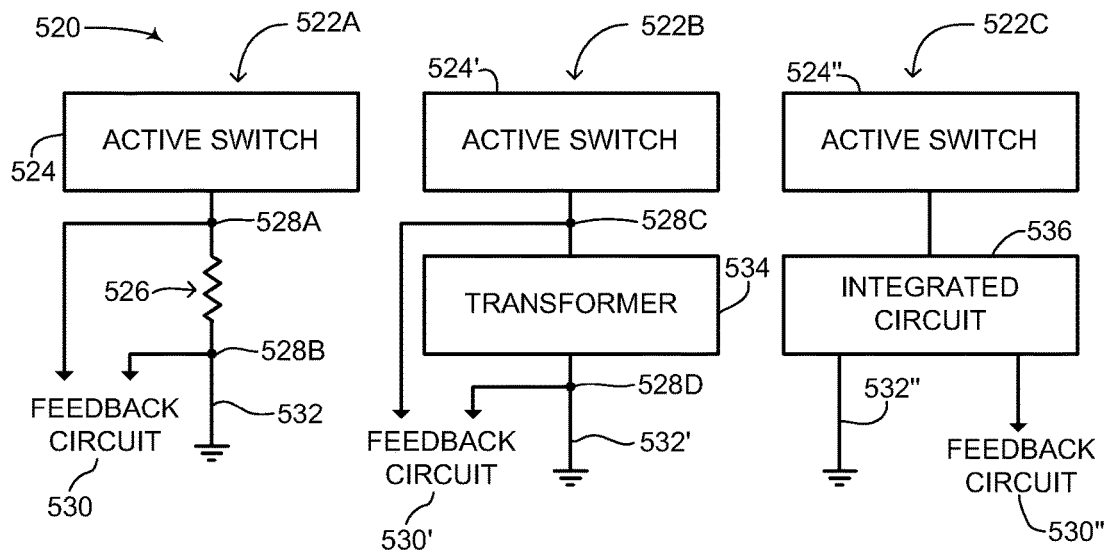
FIG. 11A is a schematic illustration of various feedback circuits in the pulsed light illuminator of FIG. 4, constructed and operative in accordance with a further embodiment of the disclosed technique.

Reference is now made to FIG. 11A, which is a schematic illustration of various feedback circuits in the pulsed light illuminator of FIG. 4, generally referenced 520, constructed and operative in accordance with a further embodiment of the disclosed technique. FIG. 11A shows three different embodiments of a feedback circuit to be used in a pulsed light illuminator, a first embodiment 522A, a second embodiment 522B and a third embodiment 522C. As described above, different applications of the pulsed light illuminator of the disclosed technique have specific requirements in terms of the intensity of the light pulses produced. According to the disclosed technique, the pulsed light illuminator may include a feedback circuit for ensuring that the light pulses produced are stable and that the transmitted optical power per light pulse is proportional to the desired current to be used in the pulsed light illuminator.

Without a feedback circuit, the pulsed light illuminator may not function and perform as efficiently as possible, might produce flickering in the images generated by the pulsed light illuminator based on reflected light pulses, might produce low quality images generated by the pulsed light illuminator based on reflected light pulses and may even cause a safety issue in applications where high peak power energy is used. Scenarios in which the above might occur include the following examples:

An unstable current between light pulses (for example, a first light pulse having an intensity of 100 amperes (herein abbreviated A) and a second light pulse having an intensity of 80 A and then repeating the variation in intensity every second light pulse) creates different optical peak power in the light pulses produced, which can affect the received reflections of those light pulses. This would be seen by a viewer as either flickering or flashing of images produced from the received reflections, which may be disruptive to a user of the pulsed light illuminator and might make video processing of the images more difficult.

If the input voltage to the light source of the pulsed light illuminator is low or includes other sources of undesired interference, lower than optimal light pulses might be produced. Instead of producing light pulses having an intensity of 100 A, light pulses of only 80 A may be produced. This again may produce weak reflections from objects in a scene or environment resulting in low image quality produced by the pulsed light illuminator.

In the situation of a component failure in the pulsed light illuminator, the resultant intensity and optical power of the produced light pulses might be higher or lower than expected.

Initially when the light source or electronic driver of the pulsed light illuminator is warming up, different components in the pulsed light illuminator might exhibit different efficiencies, for example a different ratio of input power versus produced current or a different ratio of produced current versus produced optical power. This can produce adverse effects on the performance of the pulsed light illuminator.

According to the disclosed technique, as shown in various embodiments in FIG. 11A, a feedback circuit is included in the pulsed light illuminator of the disclosed technique for indirectly measuring the current of the light pulses produced. The feedback from the measured current of the light pulse produced can be used in a variety of ways according to the disclosed technique. For example the feedback could be used to:

- Calibrate the voltage of the power supplies which deliver current to the light source. The feedback would thus serve as an input to the power supplies, the specific input determining if the power supplies should provide more or less current to the light source to achieve a desirable intensity in the generated light pulses.
- Make a user of the pulsed light illuminator aware of any abnormal behavior in the pulsed light illuminator, for example if the feedback on the intensity of the light pulses is very low or very high.
- In the case that the measured feedback indicates a very high peak power in the generated light pulses, which might be unsafe to humans and animals, the feedback may be used to stop the operation of the active switch of the pulsed light illuminator such that no current nor optical power is produced by the pulsed light illuminator of the disclosed technique. Alternatively, the feedback may be used to continue the operation of the active switch of the pulsed light illuminator but with a lower current to provide lower optical power by the pulsed light illuminator of the disclosed technique.
- The measured feedback can furthermore be used to stop operation of either one, or both, of the power supplies.

Other examples of how feedback can be used in the gated imaging system of the disclosed technique can include:

- If low peak power is detected, providing an indication that the gated imaging system cannot image a long distance DOF (such as over 1 kilometer);
- If high peak power is detected, providing an indication that the gated imaging system can image a long distance DOF (such as over 1 kilometer);
- If high peak power is detected, providing an indication that the gated imaging system can provide an improved signal-to-noise ratio (herein abbreviated SNR) image using the same number of light pulses per image frame;
- If high peak power is detected, providing an indication that the gated imaging system can provide a comparable SNR image using a smaller number of light pulses per image frame;
- If low peak power is detected, the gated imaging system can attempt to compensate for image quality by increasing the number of light pulses per image frame;
- If high peak power is detected, the sensor of the gated imaging system may change its working mode, such as by lowering its gain or by implementing a known anti-blooming mechanism;
- If low peak power is detected, the pulsed light illuminator may narrow its field-of-illumination to provide better imaging at longer distances; and
- If high peak power is detected, the pulsed light illuminator may enlarge its field-of-illumination to provide eye-safety compliance.

Whereas feedback could be directly taken from the output of the light source of the pulsed light illuminator, such a feedback circuit may alter the characteristics of the generated light pulse. As described above, after the light source generates a light pulse, a high voltage may be present on the cathode of the active switch. The current of this high voltage can be measured as it travels to a ground terminal, thus giving an indirect measurement of the intensity of the generated light pulse. Three different example embodiments for measuring the current of this high voltage are shown in FIG. 11A. For the purposes of simplicity, only the active switch and the measuring circuit are shown, however it is understood that the active switch and the measuring circuit form a part of the pulsed light illuminator of the disclosed technique, for example as shown above in FIG. 4 with regards to the active switch. The measuring circuit may also be a sampling circuit. The output of the measuring circuit can then be sent to a feedback circuit (not shown) in order to then decide how the feedback should be used to modify the functioning of the pulsed light illuminator, a gated imaging system the pulsed light illuminator is a part of or both.

In first embodiment 522A, an active switch 524 is shown coupled with a ground terminal 532. Between active switch 524 and ground terminal 532 is a shunt resistor 526. Shunt resistor 526 is coupled with active switch 524 and with ground terminal 532. Both sides of shunt resistor 526 include respective connections 528A and 528B. Shunt resistor 526 can also be a sense resistor, a 4-pin resistor and the like. Connections 528A and 528B enable current flowing from active switch 524 to ground terminal 532 to be sampled and provided to a feedback circuit 530, as shown in first embodiment 522A. Shunt resistor 526 needs to have a minimal resistance as minimal interruption of the current from active switch 524 to ground terminal 532 is desired. Minimal interruption of the current is desired as more components on the current route to ground causes delays, parasitic heat and the like. Current flowing from active switch 524 to ground terminal 532 is measured by measuring the voltage across shunt resistor 526 and if necessary, by amplifying the measured voltage. As mentioned above, the sampled voltage can be provided to feedback circuit 530.

In second embodiment 522B, an active switch 524' is shown coupled with a ground terminal 532'. Coupled between active switch 524' and ground terminal 532' is a transformer 534. Transformer 534 is substantially a coil which can be used to measure current and includes two respective connections 528C and 528D on either side of transformer 534. The ratio of the number of turns of the coil (not shown) in transformer 534 can be used to amplify the measured current and thus used to determine the current of the generated light pulse. The determined current can be provided to a feedback circuit 532' as shown in second embodiment 522B via connections 528C and 528D. In third embodiment 522C, an active switch 524" is shown coupled with a ground terminal 532". Coupled between active switch 524" and ground terminal 532" is an integrated circuit 536. Integrated circuit 536 is a circuit used to measure current. The measured current can be provided to a feedback circuit 530" which can then be used to determine the current of the generated light pulse.

As mentioned above, first embodiment 522A, second embodiment 522B and third embodiment 522C are merely examples of how current can be measured in the pulsed light illuminator of the disclosed technique. As is known to the worker skilled in the art, other embodiments exist for constructing a measuring circuit for sampling current, such as by using a comparator, analog peripherals and the like. The output of feedback circuits 530, 530' and 530" as well as the output of other embodiments for a measuring circuit can be coupled with at least one of the following components in the pulsed light illuminator and the gated imaging system of the disclosed technique: the high voltage power supply, the low voltage power supply, the active switch, the sensor and the processor.

As an additional example, in first embodiment 522A, feedback circuit 530 might be a digital processor (not shown), which decides how voltage and current in the high voltage power supply and the low voltage power supply are modified in response to the current feedback received from connections 528A and 528B. In another embodiment, feedback circuit 530 might be an analog circuit coupling between shunt resistor 526 and the low voltage power supply. In this embodiment, the current and voltage measured by the measuring circuit (i.e., shunt resistor 526) is used as input to regulate the voltage and current of the low voltage power supply in an analog manner. In this embodiment there is no processor which decides on changes to the functioning of the working current and voltage of the pulsed light illuminator; the feedback itself is used as input to regulate the working current and voltage.

Figure 11B:
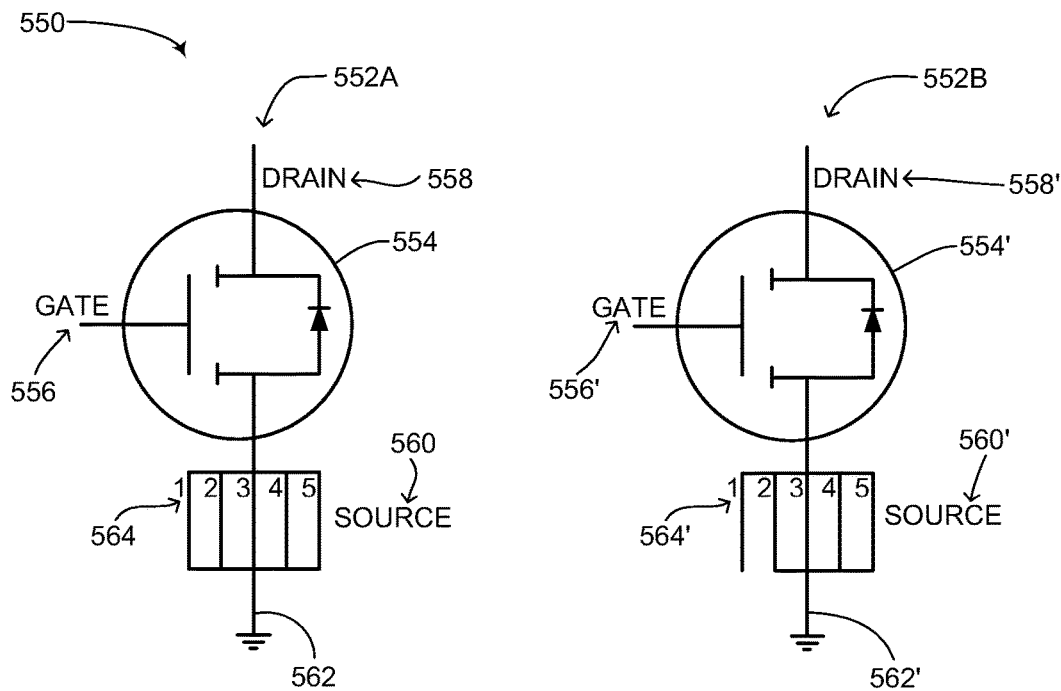
FIG. 11B is a schematic illustration of different embodiments of the active switch of the pulsed light illuminator of FIG. 4, constructed and operative in accordance with another embodiment of the disclosed technique.

Reference is now made to FIG. 11B, which is a schematic illustration of different embodiments of the active switch of the pulsed light illuminator of FIG. 4, generally referenced 550, constructed and operative in accordance with another embodiment of the disclosed technique. FIG. 11B shows two example embodiments of the active switch, a first embodiment 552A and a second embodiment 552B. In first embodiment 552A, an active switch 554 is embodied as a FET and includes a gate 556, a drain 558 and a source 560. Source 560 includes a plurality of pins 564, labeled 1-5. It is noted that the number of pins shown in plurality of pins 564 is merely an example and that different numbers of pins are also possible embodiments for source 560. Plurality of pins 564 all are shorted to the same point and are coupled with a ground terminal 562. When deactivated, gate 556 prevents the flow of current from drain 558 to source 560. As mentioned above, when a synchronization controller (not shown) provides a gate signal to active switch 554, the synchronization controller is substantially providing a signal to gate 556 to enable current to flow from drain 558 to source 560. As described above, a high current flows through active switch 554 after a light pulse has been generated. This high current exacerbates the effect of parasitic inductance in the pulsed light illuminator, for example by causing delays in the pulsed light illuminator, thus resulting in a slower rise time and fall time of the generated light pulse. This parasitic inductance can be reduced as shown below in second embodiment 552B.

In second embodiment 552B, an active switch 554' is embodied as a FET and includes a gate 556', a drain 558' and a source 560'. Source 560' includes a plurality of pins 564', labeled 1-5. Unlike in first embodiment 552A, not all of plurality of pins 564' are shorted to the same point and are coupled with a ground terminal 562'. As shown, pins 2-5 are shorted to the same point and coupled with ground terminal 562', however pin 1 is not and is used as a reference point for gate 556'. Active switch 554' is thus a FET which has one source pin not shorted to a ground terminal. Pin 1 does not enable high current to flow through it, is not coupled with ground terminal 562' and thus will reduce the effects of parasitic inductance in active switch 554'. Current will thus flow through active switch 554' with less interference. This will result in a faster rise time and fall time for the generated light pulse as less parasitic inductance will be present in the pulsed light illuminator. In addition, the pulsed light illuminator will have better efficiency, as less energy in active switch 554' will be converted into heat. In all other respects, active switch 554' functions like active switch 554. It is also noted that both first embodiment 552A and second embodiment 552B may be used in conjunction with any of the feedback circuits described above in FIG. 11A.

Figure 12:
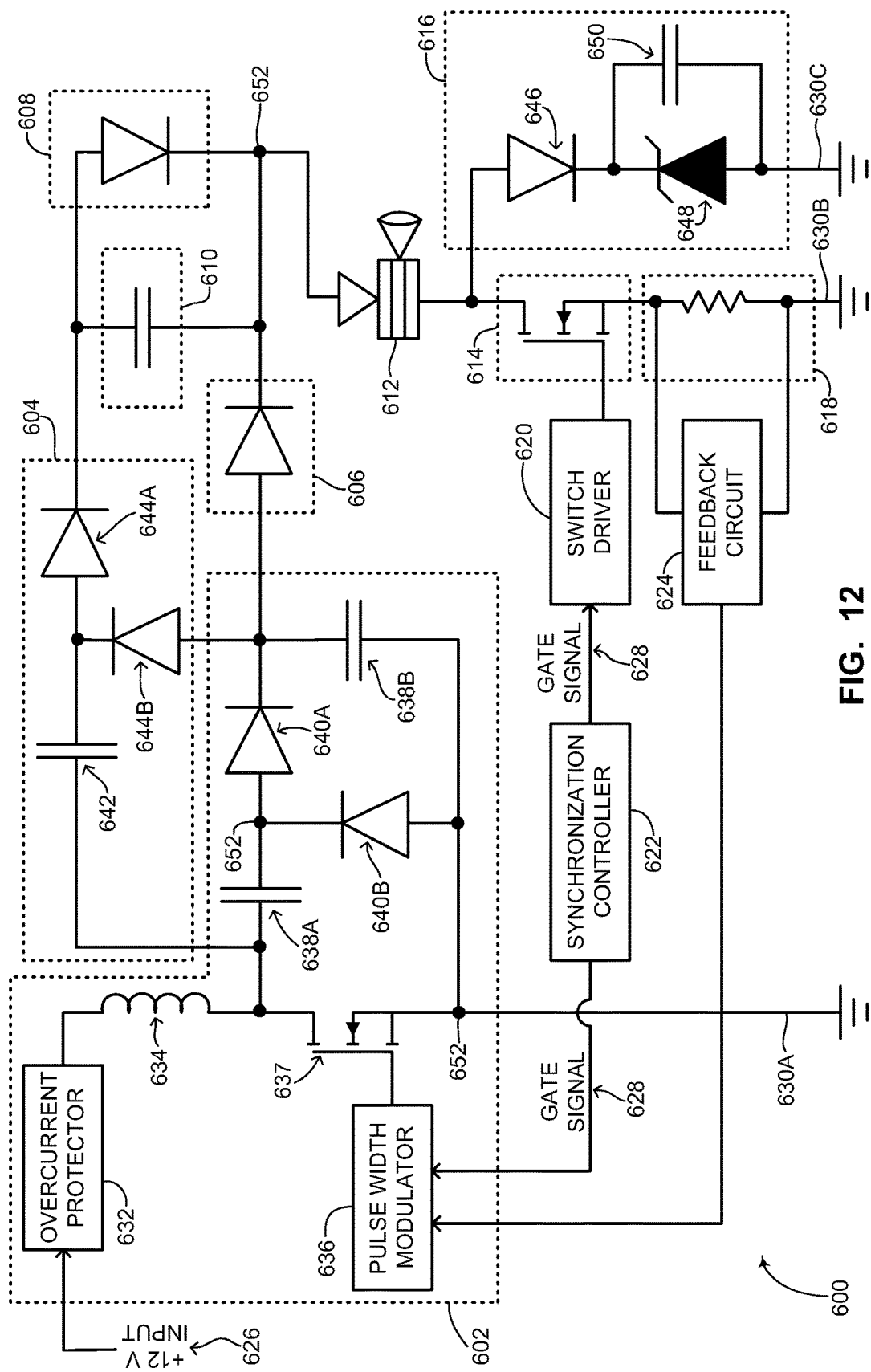
FIG. 12 is a schematic illustration of an electrical circuit embodying the pulsed light illuminator of FIG. 4, constructed and operative in accordance with a further embodiment of the disclosed technique.

Reference is now made to FIG. 12, which is a schematic illustration of an electrical circuit embodying the pulsed light illuminator of FIG. 4, generally referenced 600, constructed and operative in accordance with a further embodiment of the disclosed technique. Electrical circuit 600 is brought merely as an example of how many of the components in pulsed light illuminator 100 can be embodied in an electrical circuit. Electrical circuit 600 includes a low voltage power supply 602, a high voltage power supply 604, a first switch 606, a second switch 608, a fast voltage provider 610, a light source 612, an active switch 614, an energy discharger 616, a measuring circuit 618, a switch driver 620, a synchronization controller 622 and a feedback circuit 624. Low voltage power supply 602 is substantially similar to low voltage power supply 112 (FIG. 4), high voltage power supply 604 is substantially similar to high voltage power supply 116 (FIG. 4), first switch 606 is substantially similar to first switch 114 (FIG. 4), second switch 608 is substantially similar to second switch 118 (FIG. 4), fast voltage provider 610 is substantially similar to fast voltage provider 120 (FIG. 4), light source 612 is substantially similar to light source 104 (FIG. 4), active switch 614 is substantially similar to active switch 106 (FIG. 4), energy discharger 616 is substantially similar to energy discharger 122 (FIG. 4), measuring circuit 618 is substantially similar to first embodiment 522A (FIG. 11A) of the measuring circuits shown in FIG. 11A, switch driver 620 is substantially similar to switch driver 102 (FIG. 4), synchronization controller 622 is substantially similar to synchronization controller 108 (FIG. 4) and a feedback circuit 624 is substantially similar to feedback circuit 530 (FIG. 11A).

Low voltage power supply 602 includes an overcurrent protector 632, an inductor 634, a pulse width modulator (herein abbreviated PWM) 636, a FET 637, a first capacitor 638A, a second capacitor 638B, a first diode 640A and a second diode 640B. Inductor 634 is coupled between overcurrent protector 632, first capacitor 638A and FET 637. FET 637 is coupled with PWM 636 and a ground terminal 630A. First diode 640A and second capacitor 638B are coupled with first capacitor 638A whereas second diode 640B is coupled with first capacitor 638A and first diode 640A. High voltage power supply 604 includes a capacitor 642, a first diode 644A and a second diode 644B. Capacitor 642 is coupled in series with first diode 644A and with second diode 644B.

As shown, first switch 606 is embodied as a diode and second switch 608 is also embodied as a diode. Fast voltage provider 610 is embodied as an acceleration capacitor. Light source 612 is embodied as a VCSEL, and active switch 614 is embodied as an FET. Energy discharger 616 includes a diode 646, a Zener diode 648 and a capacitor 650. Zener diode 648 and capacitor 650 are coupled in parallel with one another and both are coupled in series with diode 646. Both Zener diode 648 and capacitor 650 are coupled with a ground terminal 630C. Measuring circuit 618 is embodied as a resistor and is coupled with a ground terminal 630B. Switch driver 620 is coupled with the gate (not labeled) of FET 614. Feedback circuit 624 is coupled in parallel with resistor 618 and with PWM 636. Synchronization controller 622 is coupled with switch driver 620 and PWM 636. Electrical connections between electrical components in FIG. 12 are shown by a plurality of black dots 652, not all of which are labeled to keep FIG. 12 from being too cluttered with numbers.

As shown, low voltage power supply 602 is coupled with high voltage power supply 604 at two connection points (not labeled). Low voltage power supply 602 is also coupled with diode 606. High voltage power supply 604 is coupled with acceleration capacitor 610 and with diode 608. Diode 606 is coupled with diode 608, acceleration capacitor 610 and light source 612. Light source 612 is coupled with both active switch 614 and energy discharger 616. Active switch 614 is coupled with resistor 618.

Electrical circuit 600 receives an input voltage 626, as shown for example being +12 volts. Input voltage 626 is provided to overcurrent protector 632 which protects the other components in low voltage power supply 602. Overcurrent protector 632 can be for example a voltage regulator. Synchronization controller provides a gate signal 628 simultaneously to switch driver 620 and PWM 636. PWM 636 is used to generate a stable voltage and modulates the low power voltage generated by low voltage power supply 602 by controlling FET 637. As shown in FIG. 12, high voltage power supply 604 does not receive an external input voltage like low voltage power supply 602 but receive an input voltage from low voltage power supply 602. High voltage power supply 604 is embodied as a voltage multiplier and is substantially a "virtual" high voltage power supply, as described above in FIG. 4. Gate signal 628 substantially activates FET 614 as well as low voltage power supply 602 and high voltage power supply 604 for providing low and high voltages respectively to light source 612 and for enabling current and voltage to pass through light source 612, thereby generating the light pulse (not shown) to be produced. As shown, high voltage power supply 604 loads voltage and current onto acceleration capacitor 610 which provides the high voltage and current to light source 612. In addition, diodes 606 and 608 enable both low voltage power supply 602 and high voltage power supply 604, which have significantly different electrical potentials, to be both coupled indirectly with light source 612. Resistor 618 provides a measure of the current and voltage on light source 612 to feedback circuit 624, which as mentioned above in FIG. 11A can be a digital processor or analog components. The output of feedback circuit 624 is provided to PWM 636 for modifying various parameters of the signal generated by low voltage power supply 602. As shown, the modification to the signal generated by low voltage power supply 602 is based upon the feedback received feedback circuit 624 and resistor 618, which is essentially an indication of the parameters of the light pulse emitted by light source 612.

As mentioned above, FIG. 12 is merely brought as an example of how to construct an electrical circuit embodying the pulsed light illuminator described above in FIG. 4. Many other possibilities exist for how to embody pulsed light illuminator 100 (FIG. 4) in an electrical circuit and these possibilities are design choices within the knowledge of the worker skilled in the art.

It will be appreciated by persons skilled in the art that the disclosed technique is not limited to what has been particularly shown and described hereinabove. Rather the scope of the disclosed technique is defined only by the claims, which follow.

The invention claimed is:

1. Pulsed light illuminator for generating at least one light pulse having a predefined rise time and fall time, comprising:
   a semiconductor light source, for generating and emitting said at least one light pulse;
   an electronic driver, coupled with said semiconductor light source, for providing a drive current to said semiconductor light source; and
   a synchronization controller, coupled with said electronic driver,
   said electronic driver comprising:
      an active switch, coupled with said semiconductor light source, for enabling and disabling said drive current through said semiconductor light source;
      a switch driver, coupled with said active switch and said synchronization controller,
      a high voltage power supply, for generating a high first polarity voltage;
      a fast voltage provider, for rapidly providing said generated high first polarity voltage to said semiconductor light source;
      a low voltage power supply, for generating a low voltage;
      a first switch, coupled with said low voltage power supply and said semiconductor light source, for protecting said low voltage power supply from said high voltage power supply;
      a second switch, coupled with said high voltage power supply and said semiconductor light source, for preventing current backflow towards said high voltage power supply; and
      an energy discharger, coupled with said semiconductor light source,
   wherein said synchronization controller is for synchronizing a timing of said active switch via a synchronization signal;
   wherein said switch driver is for amplifying said synchronization signal;
   wherein when said active switch is enabled, said high first polarity voltage is provided from said fast voltage provider to said semiconductor light source for generating a rise time of said at least one light pulse and said low voltage is provided to said semiconductor light source for maintaining a pulse width of said at least one light pulse;
   wherein when said active switch is disabled, a fall time of said at least one light pulse is achieved for terminating said at least one light pulse, said semiconductor light source exhibiting a high second polarity voltage;

wherein said energy discharger enables said high second polarity voltage to discharge from said semiconductor light source, thereby accelerating said fall time;

wherein said pulsed light illuminator is mounted on a moving platform;

wherein said at least one light pulse is varied according to a parameter of said moving platform; and wherein said parameter is at least one of:
a velocity of said moving platform;
an acceleration of said moving platform;
a location of said moving platform; or
an orientation of said moving platform.

2. The pulsed light illuminator according to claim 1, wherein said synchronization controller is coupled with an external sensor.

3. The pulsed light illuminator according to claim 1, wherein said pulsed light illuminator is mounted on a stationary platform.

4. The pulsed light illuminator according to claim 1, wherein an average power density of said at least one light pulse is varied according to at least one of:
said electronic driver comprising a circuit for varying a drive current according to said parameter of said moving platform;
varying said pulse width;
varying a number of said at least one light pulse per given time interval; or
enlarging a field of illumination of said semiconductor light source.

5. The pulsed light illuminator according to claim 4, wherein said drive current is decreased as said velocity decreases and increased as said velocity increases, thereby keeping an optical power density of said at least one light pulse within at least one of:
an eye-safe level; or
a skin-safe level.

6. The pulsed light illuminator according to claim 1, wherein said moving platform is selected from the list consisting of:
a vehicle;
an autonomous vehicle;
a non-autonomous vehicle;
a land vehicle;
a train;
a sea vehicle;
a transportation element;
a robot;
a fixed-wing aircraft;
a rotary-wing aircraft; and
a space vehicle.

7. The pulsed light illuminator according to claim 1, wherein said moving platform is a vehicle and wherein said pulsed light illuminator is integrated into a light source of said vehicle.

8. The pulsed light illuminator according to claim 1, wherein said at least one light pulse has a wavelength in a near-infrared (NIR) spectrum.

9. The pulsed light illuminator according to claim 8, further comprising an additional light source for masking said at least one light pulse in said NIR spectrum.

10. The pulsed light illuminator according to claim 1, wherein at least one of said first switch and said second switch is selected from the list consisting of:
a passive switch;
a diode;
an active switch;
a transistor and isolator;
a transistor and coil;
an integrated circuit (IC); and
a galvanic switch.

11. The pulsed light illuminator according to claim 1, wherein said fast voltage provider is positioned in said electronic driver according to a position selected from the list consisting of:
between said high voltage power supply and said second switch; and
between said second switch and said semiconductor light source.

12. The pulsed light illuminator according to claim 1, wherein said fast voltage provider is an energy bank comprising:
an electronic component, coupled with said second switch; and
an acceleration capacitor, coupled with said electronic component and said semiconductor light source, for storing said high first polarity voltage,
wherein said electronic component enables voltage to oscillate in said energy bank between said electronic component and said acceleration capacitor; and
wherein said electronic component is selected from the list consisting of:
a charging inductor; and
a resistor.

13. The pulsed light illuminator according to claim 1, wherein said semiconductor light source is selected from the list consisting of:
a vertical-cavity surface-emitting laser (VCSEL);
an edge-emitting laser;
a quantum dot laser;
an array of light-emitting diodes (LEDs);
a light source with a single central wavelength;
a light source with a plurality of central wavelengths;
a light source with a narrow spectrum; and
a light source with a wide spectrum.

14. The pulsed light illuminator according to claim 1, said semiconductor light source comprising a plurality of vertical-cavity surface-emitting lasers (VCSELs) configured on a single integrated chip (IC).

15. The pulsed light illuminator according to claim 1, wherein said semiconductor light source operates with a low overall duty cycle.

16. The pulsed light illuminator according to claim 1, wherein both said rise time and said fall time are on the order of tens of nanoseconds (ns).

17. The pulsed light illuminator according to claim 1, wherein said low voltage is on the order of between 2 to 30 volts and wherein both said high first polarity voltage and said high second polarity voltage are on the order of between 10 to 60 volts.

18. The pulsed light illuminator according to claim 1, wherein said synchronization controller activates said active switch on the order of units of microseconds (μs).

19. The pulsed light illuminator according to claim 1, wherein a field of illumination of said semiconductor light source is modified according to a parameter selected from the list consisting of:
a velocity of a moving platform said pulsed light illuminator is mounted on;
an angular momentum of said moving platform said pulsed light illuminator is mounted on;
a type of scenery; and
a weather condition.

20. Low visibility vision system comprising:
a pulsed light illuminator for generating at least one light pulse having a predefined rise time and fall time, for illuminating at least one object;
a sensor, coupled with said pulsed light illuminator, for sensing at least one reflection of said at least one light pulse from said at least one object; and
a processor, coupled with said sensor and said pulsed light illuminator, for generating a signal representative of said at least one object from said at least one reflection,
said pulsed light illuminator comprising:
- a semiconductor light source, for generating and emitting said at least one light pulse;
- an electronic driver, coupled with said semiconductor light source, for providing a drive current to said semiconductor light source; and
- a synchronization controller, coupled with said electronic driver,
said electronic driver comprising:
- an active switch, coupled with said semiconductor light source, for enabling and disabling said drive current through said semiconductor light source;
- a switch driver, coupled with said active switch and said synchronization controller,
- a high voltage power supply, for generating a high first polarity voltage;
- a fast voltage provider, for rapidly providing said generated high first polarity voltage to said semiconductor light source;
- a low voltage power supply, for generating a low voltage;
- a first switch, coupled with said low voltage power supply and said semiconductor light source, for protecting said low voltage power supply from said high voltage power supply;
- a second switch, coupled with said high voltage power supply and said semiconductor light source, for preventing current backflow towards said high voltage power supply; and
- an energy discharger, coupled with said semiconductor light source,
wherein said synchronization controller is for synchronizing a timing of said active switch via a synchronization signal;
wherein said switch driver is for amplifying said synchronization signal;
wherein when said active switch is enabled, said high first polarity voltage is provided from said fast voltage provider to said semiconductor light source for generating a rise time of said at least one light pulse and said low voltage is provided to said semiconductor light source for maintaining a pulse width of said at least one light pulse;
wherein when said active switch is disabled, a fall time of said at least one light pulse is achieved for terminating said at least one light pulse, said semiconductor light source exhibiting a high second polarity voltage;
wherein said energy discharger enables said high second polarity voltage to discharge from said semiconductor light source, thereby accelerating said fall time;
wherein said pulsed light illuminator is mounted on a moving platform;
wherein said at least one light pulse is varied according to a parameter of said moving platform; and
wherein said parameter is at least one of:
a velocity of said moving platform;
an acceleration of said moving platform;
a location of said moving platform; or
an orientation of said moving platform.

\* \* \* \* \*